(12) United States Patent
Tatani et al.

(10) Patent No.: US 8,860,099 B2
(45) Date of Patent: Oct. 14, 2014

(54) SOLID-STATE IMAGING DEVICE AND METHOD FOR MANUFACTURING SOLID-STATE IMAGING DEVICE, AND ELECTRONIC DEVICE

(75) Inventors: Keiji Tatani, Kumamoto (JP); Fumihiko Koga, Kanagawa (JP); Takashi Nagano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/881,643

(22) Filed: Sep. 14, 2010

(65) Prior Publication Data

US 2011/0073923 A1 Mar. 31, 2011

(30) Foreign Application Priority Data

Sep. 25, 2009 (JP) .................................. 2009-221387

(51) Int. Cl.
*H01L 31/062* (2012.01)
*H01L 31/113* (2006.01)
*H01L 27/146* (2006.01)

(52) U.S. Cl.
CPC .... *H01L 27/14689* (2013.01); *H01L 27/14603* (2013.01); *H01L 27/14609* (2013.01); *H01L 27/1463* (2013.01)
USPC ........... 257/291; 257/290; 257/292; 257/233; 257/535; 257/230; 438/448; 438/59; 358/482; 348/294

(58) Field of Classification Search
CPC .................. H01L 27/14603; H01L 27/14689; H01L 27/14609; H01L 2924/00; H01L 27/14643; H01L 27/1463; H01L 27/14636; H01L 27/146
USPC .................. 257/290–292, 239, 233, 535, 230; 438/448, 643; 358/482; 348/294
See application file for complete search history.

(56) References Cited

U.S. PATENT DOCUMENTS

| | | | |
|---|---|---|---|
| 7,616,355 B2 * | 11/2009 | Yoneda et al. | 358/482 |
| 7,855,407 B2 * | 12/2010 | Shim | 257/290 |
| 8,217,330 B2 * | 7/2012 | Sakai et al. | 250/208.1 |
| 2007/0200181 A1 * | 8/2007 | Rhodes | 257/384 |
| 2010/0123174 A1 * | 5/2010 | Mao et al. | 257/291 |
| 2011/0272750 A1 * | 11/2011 | Iwata et al. | 257/291 |

FOREIGN PATENT DOCUMENTS

| | | |
|---|---|---|
| JP | 2003-179138 | 6/2003 |
| JP | 2006-054276 | 2/2006 |
| JP | 2006-073567 | 3/2006 |
| JP | 2006-073735 | 3/2006 |
| JP | 2006-086232 | 3/2006 |
| JP | 2006-216616 | 8/2006 |
| JP | 2006-269546 | 10/2006 |
| JP | 2009-043932 | 2/2009 |
| JP | 2009-135319 | 6/2009 |

OTHER PUBLICATIONS

Japanese Office Action dated Nov. 5, 2014 issued in connection with counterpart Japanese Patent Application No. 2009-221387.

* cited by examiner

*Primary Examiner* — Fernando L Toledo
*Assistant Examiner* — Mohammed Shamsuzzaman
(74) *Attorney, Agent, or Firm* — Dentons US LLP

(57) ABSTRACT

A solid-state imaging device includes a first-conductivity-type semiconductor well region, a plurality of pixels each of which is formed on the semiconductor well region and is composed of a photoelectric conversion portion and a pixel transistor, an element isolation region provided between the pixels and in the pixels, and an element isolation region being free from an insulation film and being provided between desired pixel transistors.

23 Claims, 24 Drawing Sheets

Reference Example

Reference Example

Reference Example
FIG. 20
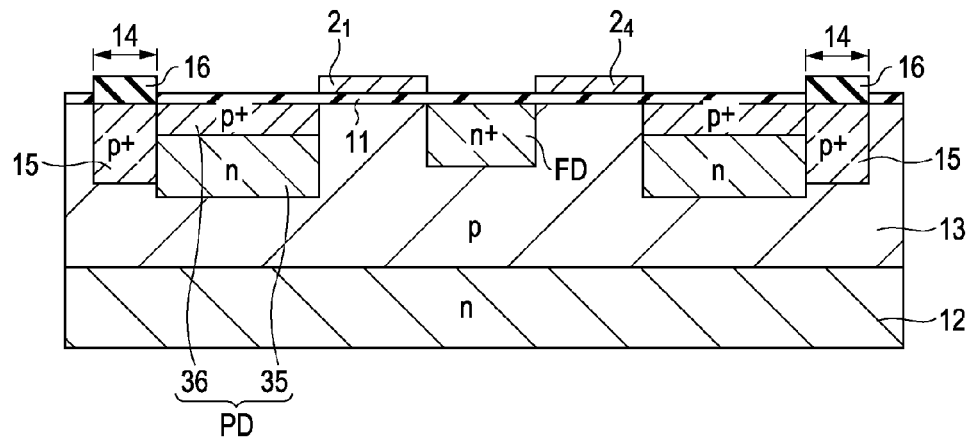
Reference Example FIG. 21
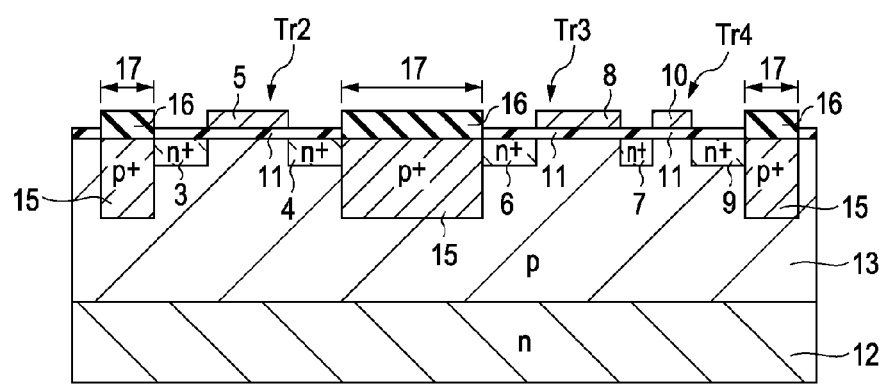

Reference Example

US 8,860,099 B2

SOLID-STATE IMAGING DEVICE AND METHOD FOR MANUFACTURING SOLID-STATE IMAGING DEVICE, AND ELECTRONIC DEVICE

BACKGROUND OF THE INVENTION

1. Field of the Invention

The present invention relates to a solid-state imaging device and a method for manufacturing the solid-state imaging device, and an electronic device such as a camera which is equipped with the solid-state imaging device.

2. Description of the Related Art

As a solid-state imaging device, a CMOS solid-state imaging device is used. The CMOS solid-state imaging device has a low power-source voltage and consumes less power so as to be used in a digital still camera, a digital video camera, various mobile terminal devices such as a camera-equipped mobile phone, and the like.

The CMOS solid-state imaging device includes a pixel region in which a plurality of pixels are two-dimensionally arranged in a regular manner and a peripheral circuit portion which is disposed around the pixel region. Each of the pixels is composed of a photodiode which is a photoelectric conversion portion and a plurality of pixel transistors. The peripheral circuit portion includes a row circuit (vertical driving unit) for propagating a signal in a row direction, a horizontal circuit (horizontal transfer unit) for sequentially transmitting a signal of each row propagated by the row circuit to an output circuit, and the like. The plurality of pixel transistors have a three-transistor configuration which includes a transfer transistor, a reset transistor, and an amplification transistor, or have a four-transistor configuration which includes the above three transistors and a selection transistor, for example.

In a common CMOS solid-state imaging device, a plurality of unit pixels each of which is composed of one photodiode and a plurality of pixel transistors are arranged. A pixel size has been made smaller in recent years, so that a so-called pixel sharing CMOS solid-state imaging device is developed. In the pixel sharing CMOS solid-state imaging device, a pixel transistor is shared by a plurality of pixels so as to reduce the number of pixel transistors per unit pixel and enlarge a photodiode area (refer to Japanese Unexamined Patent Application Publication No. 2006-54276 and Japanese Unexamined Patent Application Publication No. 2009-135319).

At the same time, in a CMOS solid-state imaging device, a p-type semiconductor well region is formed on an n-type semiconductor substrate, for example, and a plurality of pixels are formed in a part, which corresponds to a pixel region, of the p-type semiconductor well region. Then, well potential is applied through a well contact portion to the p-type semiconductor well region so as to stabilize well potential (refer to Japanese Unexamined Patent Application Publication No. 2006-269546, Japanese Unexamined Patent Application Publication No. 2006-73567, and Japanese Unexamined Patent Application Publication No. 2006-86232).

SUMMARY OF THE INVENTION

However, in the CMOS solid-state imaging device, as the number of pixels is increased and an area of the pixel region is enlarged, such problem arises that well potential fluctuates in a semiconductor well region. It has been verified that the fluctuation of well potential arises because well potential in a pixel region is affected by voltage fluctuation of a power source line and the like, and therefore a pixel characteristic fluctuates.

In order to prevent the fluctuation of well potential, it is effective that a well contact portion is arranged in the pixel region. However, this case has a problem of a position at which the well contact portion is arranged and a problem of a process increase for ion implantation performed for reducing contact resistance. Depending on the position at which the well contact portion is arranged, a symmetric property of a pixel is deteriorated, and the pixel characteristic is adversely affected by sensitivity difference among pixels. Further, depending on the position at which the well contact portion is arranged, deterioration of the pixel characteristic such as an occurrence of white spots is also concerned. For example, a photodiode is adversely affected depending on an impurity concentration of the well contact portion. Further, when the well contact portion is arranged at a region close to the photodiode, there is high possibility that the well contact region adversely affects the photodiode and deteriorates the pixel characteristic.

As a reference example, FIGS. 19A to 22 illustrate a four-pixel sharing solid-state imaging device in which a well contact portion is arranged in a forming region of a photodiode to be a photoelectric conversion portion. FIG. 19A is a schematic plan view showing a chief part of a pixel region. FIG. 20 is a sectional view taken along a XX-XX line of FIG. 19A. FIG. 21 is a sectional view taken along a XXI-XXI line of FIG. 19A. FIG. 22 is a sectional view taken along a XXII-XXII line of FIG. 19A. A solid-state imaging device 1 according to the reference example includes a pixel region 2 in which single sharing units are arranged in a two-dimensional array fashion. Each of the single sharing units is composed of photodiodes PD [PD1 to PD4] of four pixels arranged two pixels in width and two pixels in length (that is, four-pixel sharing). In a single sharing unit, one floating diffusion portion FD is shared by the four photodiodes PD [PD1 to PD4]. Pixel transistors are four transfer transistors Tr1 [Tr11 to Tr14], and one reset transistor Tr2, one amplification transistor Tr3, and one selection transistor Tr4 which are shared.

The floating diffusion portion FD is arranged at the center surrounded by the four photodiodes PD1 to PD4. The transfer transistors Tr11 to Tr14 are respectively provided with transfer gate electrodes 2 [$2_1$ to $2_4$] that are respectively disposed between the floating diffusion portion FD which is shared and the corresponding photodiodes PD.

The reset transistor Tr2, the amplification transistor Tr3, and the selection transistor Tr4 are formed in a transistor forming region positioned apart from a photodiode forming region in which the photodiodes PD, the floating diffusion portion FD, and the transfer transistors Tr1 are formed. The reset transistor Tr2 is composed of a pair of source/drain regions 3 and 4 and a reset gate electrode 5. The amplification transistor Tr3 is composed of a pair of source/drain regions 6 and 7 and an amplification gate electrode 8. The selection transistor Tr4 is composed of a pair of source/drain regions 7 and 9 and a selection gate electrode 10.

These photodiodes PD and pixel transistors (Tr1 to Tr4) are formed on a p-type semiconductor well region 13 formed on an n-type semiconductor substrate 12 as shown in sectional views of FIGS. 20 to 22. That is, the p-type semiconductor well region 13 is formed on the n-type semiconductor substrate 12, and the photodiodes PD and the pixel transistors Tr1 to Tr4 are formed on a part, corresponding to the pixel region, of the p-type semiconductor well region 13. The photodiode PD is composed of an n-type semiconductor region 35 and a p-type semiconductor region 36 which is formed on a surface of the n-type semiconductor region 35 and has a high-impurity concentration. The transfer transistors Tr11 to Tr14 are respectively provided with the transfer gate electrodes 2 [$2_1$ to $2_4$] which are formed between the floating diffusion portion FD, which is shared and is an n-type semiconductor region, and the photodiodes PD1 to PD4 with a gate insulation film 11 interposed.

The reset transistor Tr2 is composed of the pair of n-type source/drain regions 3 and 4 and the reset gate electrode 5 with the gate insulation film 11 interposed. The amplification transistor Tr3 is composed of the pair of n-type source/drain regions 6 and 7 and the amplification gate electrode 8 with the gate insulation film 11 interposed. The selection transistor Tr4 is composed of the pair of n-type source/drain regions 7 and 9 and the selection gate electrode 10 with the gate insulation film 11 interposed (refer to FIG. 19A).

The floating diffusion portion FD is coupled to one region 4 of the source/drain regions of the reset transistor Tr2 and the amplification gate electrode 8 through a connecting wiring 12 (refer to FIG. 19A).

On the other hand, an element isolation region 14 in the photodiode forming region includes an impurity diffusion region, namely a p-type semiconductor region 15 having a high impurity concentration in this example, and an insulation film 16 formed on a surface of the p-type semiconductor region 15. An element isolation region 17 in the transistor forming region also includes the p-type semiconductor region 15 having a high impurity concentration and the insulation film 16 formed on the surface of the p-type semiconductor region 15. Then, a well contact region 19 to be a well contact portion is formed on the element isolation region 14 of the photodiode forming region. The well contact region 19 is formed on a desired position between adjacent single sharing units. The element isolation region 14 below the well contact region 19 is composed only of the p-type semiconductor region 15. The well contact region 19 composed of a p-type semiconductor region having higher impurity concentration than the p-type semiconductor region 15 is formed on the surface of the p-type semiconductor region 15 of the element isolation region 14.

A method for manufacturing the solid-state imaging device 1 according to the reference example will be schematically described with reference to FIGS. 23 to 28. FIGS. 23 to 28 schematically show a region 21 for the photodiodes PD including the floating diffusion portion FD, a region 22 for the pixel transistors Tr2 to Tr4, and a region 23 for a p-channel transistor of the peripheral circuit portion.

An element isolation region is formed at a surface side of the n-type semiconductor substrate 12 as shown in FIG. 23. Namely, an element isolation region 18 having an STI structure in which an insulation film 18A is embedded is formed at a peripheral circuit portion side (the region 23). At a pixel region side (the regions 21 and 22), the insulation film 16 of the element isolation regions 14 and 17 which are composed of the p-type semiconductor region 15 and the insulation film 16 is formed. Next, the p-type semiconductor well region 13 is formed on the whole region, which corresponds to the pixel region (the regions 21 and 22) and the peripheral circuit portion (the region 23), of the n-type semiconductor substrate 12. An n-type semiconductor well region 20 is formed in the region 23 at the peripheral circuit portion side.

The transfer gate electrode 2 [$2_1$ to $2_4$] is formed on a region, which corresponds to the region 21 for the photodiodes PD, of the p-type semiconductor well region 13 with the gate insulation film 11 interposed. The reset gate electrode 5, the amplification gate electrode 8, and the selection gate electrode 10 are formed on a region, which corresponds to the region 22 for the pixel transistors, of the p-type semiconductor well region 13 with the gate insulation film 11 interposed. A gate electrode 24 of a p-channel MOS transistor is formed on the n-type semiconductor well region 20 corresponding to the region 23 for a p-channel MOS transistor of the peripheral circuit portion with the gate insulation film 11 interposed. Though it is not shown, a gate electrode for an n-channel MOS transistor of the peripheral circuit portion is formed at the same time.

Before and after a process for forming each of the gate electrodes 2 [$2_1$ to $2_4$], 5, 8, 10, and 24, impurity ion implantation for forming the photodiode PD is performed. By this previous and following ion implantation, the n-type semiconductor region 35 and the p-type semiconductor region 36 on a surface of the n-type semiconductor region 35 are formed and thus the photodiode PD is formed. Further, in a process before or after the process for forming each of the gate electrodes 2 [$2_1$ to $2_4$], 5, 8, 10, and 24, p-type impurity is ion-implanted through the insulation film 16 constituting the element isolation region 14 at the pixel region side (the regions 21 and 22) so as to form the p-type semiconductor region 15. The element isolation region 14 is composed of this p-type semiconductor region 15 and the insulation film 16 formed on the p-type semiconductor region 15. On the other hand, the element isolation region 14 below the well contact portion is composed only of the p-type semiconductor region 15 without forming the insulation film 16 on the surface of the p-type semiconductor region 15.

Next, as shown in FIG. 24, a protection film 26 which is a silicon nitride film, for example, for protecting the photodiode PD and the like is selectively formed in the region 21 for the photodiodes PD.

Subsequently, as shown in FIG. 25, n-type impurity 25 is ion-implanted into the regions 21 and 22 for the pixel region so as to form the n-type source/drain regions 3, 4, 6, and 7 including the n-type floating diffusion portion FD. Further, p-type impurity 27 is ion-implanted into the region 23 for the peripheral circuit portion so as to form a pair of p-type source/drain regions 28 and 29.

Next, as shown in FIG. 26, p-type impurity 31 is ion-implanted into a surface of the p-type semiconductor region 15 of the element isolation region 14 with a resist mask 30 interposed so as to form the p-type well contact region 19 at a desired position in the region 21 for the photodiodes. The p-type well contact region 19 is formed on a surface of the element isolation region 14 composed only of the p-type semiconductor region 15.

Subsequently, an interlayer insulation film 32 is formed on the substrate, as shown in FIG. 27. The interlayer insulation film 32 is an interlayer film used in forming wirings of a plurality of layers.

Next, as shown in FIG. 28, a contact hall is formed in the interlayer insulation film 32 so as to embed the conductive via 33, which is coupled with the well contact region 19, in the contact hall. After that, wirings 34 and the interlayer insulation films 32 are formed in a multilayer fashion so as to form a multilayer wiring layer. Further, a planarization film, an on-chip color filter, and an on-chip micro-lens are formed on the multilayer wiring layer, though they are not shown. Thus, the solid-state imaging device 1 is manufactured.

In the solid-state imaging device 1 according to the reference example, the p-type well contact region 19 is arranged in the region for the photodiode, so that a symmetric property of a pixel is not obtained. When one photodiode PD1 is considered, for example, the transfer gate electrode $2_1$ is formed only in one direction, as shown in FIG. 19B. Light L is made incident on the photodiode PD1 from all directions. At this time, though light La incident from a lower right direction is blocked by the transfer gate electrode $2_1$, other light L is hardly blocked by the transfer gate electrode $2_1$, causing asymmetry of light incidence. As a result, adverse effect such as sensitivity difference among pixels is exerted on the pixel characteristic. Further, depending on the position on which the p-type well contact region 19 is arranged, deterioration of the pixel characteristic such as occurrence of white spots is also concerned as described above. Furthermore, as apparent in the manufacturing method, the p-type well contact region 19 is separately formed by ion implantation, increasing the number of manufacturing steps.

At the same time, the pixel characteristic is deteriorated also by the element isolation region in the pixel region. For example, in a case where an element isolation region having a shallow trench isolation (STI) structure is formed at a side of the photodiode, deterioration such as dark current or white spots may arise. It is better that the element isolation region composed of an oxide film is reduced as much as possible within a range that element isolation is possible.

It is desirable to provide a solid-state imaging device and a method for manufacturing the solid-state imaging device in which at least a pixel characteristic is improved while stabilizing well potential in an effective pixel region and the number of manufacturing steps can be reduced.

Further, it is desirable to provide an electronic device equipped with the solid-state imaging device and being applicable to a camera and the like.

A solid-state imaging device according to an embodiment of the present invention includes a first-conductivity-type semiconductor well region, a plurality of pixels each of which is formed on the semiconductor well region and is composed of a photoelectric conversion portion and a pixel transistor, an element isolation region provided between the pixels and in the pixels, and an element isolation region being free from an insulation film and being provided between desired pixel transistors.

According to the solid-state imaging device of the embodiment of the present invention, the plurality of pixels composed of the photoelectric conversion portion and the pixel transistor are formed in the semiconductor well region and the element isolation region free from an insulation film between desired pixel transistors. Therefore, the element isolation region free from an insulation film can be used also as the well contact portion. Accordingly, the well contact portion does not adversely affect the photoelectric conversion portion.

A method for manufacturing a solid-state imaging device, according to an embodiment of the present invention, includes the steps of forming an insulation film constituting an element isolation region in a pixel region of a semiconductor substrate and forming a first-conductivity-type semiconductor well region in the pixel region of the semiconductor substrate, forming a gate electrode of a pixel transistor on the semiconductor well region with a gate insulation film interposed, forming a photoelectric conversion portion by impurity ion implantation performed before and after the step of forming the gate electrode, forming a first-conductivity-type impurity diffusion region constituting an element isolation region at least between adjacent photoelectric conversion portions and between desired pixel transistors adjacent to each other at timing of one of before and after the step of forming the gate electrode, and forming a second-conductivity-type source/drain regions of the pixel transistor and forming a first-conductivity-type well contact portion that is used for applying a fixed voltage to the semiconductor well region and serves also as an element isolation region, on a surface of the first-conductivity-type impurity diffusion region constituting the element isolation region and being provided between the desired pixel transistors adjacent to each other.

It is favorable that the well contact portion is simultaneously formed with the first conductive source/drain regions of a CMOS transistor in the peripheral circuit portion.

The method for manufacturing a solid-state imaging device according to the embodiment includes the step of forming the first-conductivity-type well contact portion serving also as the element isolation region between adjacent pixel transistors. Therefore, the well contact portion does not adversely affect the photoelectric conversion portion.

The first-conductivity-type well contact portion is simultaneously formed with the first conductive source/drain regions of the CMOS transistor in the peripheral circuit portion, reducing a process of the ion-implantation.

An electronic device according to an embodiment of the present invention includes an optical system, a solid-state imaging device, and a signal processing circuit configured to process an output signal of the solid-state imaging device. The solid-state imaging device includes a first-conductivity-type semiconductor well region, and a plurality of pixels each of which is formed on the semiconductor well region and is composed of a photoelectric conversion portion and a pixel transistor. The solid-state imaging device further includes an element isolation region provided between the pixels and in the pixels, and a well contact portion that is formed between desired pixel transistors to serve also as an element isolation region being free from an insulation film, and is used for applying a fixed voltage to the semiconductor well region.

In the electronic device according to the embodiment of the present invention, the well contact portion is formed between adjacent pixel transistors so as to serve as the element isolation region. Therefore, the well contact portion does not adversely affect the photoelectric conversion portion.

According to the solid-state imaging device of the embodiment, at least the pixel characteristic can be improved while stabilizing well potential in an effective pixel region.

According to the method for manufacturing a solid-state imaging device of the embodiment, a solid-state imaging device in which at least the pixel characteristic can be improved while stabilizing well potential in an effective pixel region can be manufactured. When the first-conductivity-type well contact region is simultaneously formed with the first conductive source/drain regions of a CMOS transistor in the peripheral circuit portion, the process of the ion implantation is cut off, being able to reduce the number of the total manufacturing steps.

The electronic device according to the embodiment of the present invention is provided with the solid-state imaging device of the embodiment described earlier, so that the pixel characteristic in the solid-state imaging device is improved. Therefore, a high quality electronic device having high image quality can be provided.

BRIEF DESCRIPTION OF THE DRAWINGS

FIG. 20 is a sectional view taken along a XX-XX line of FIG. 19A;

FIG. 21 is a sectional view taken along a XXI-XXI line of FIG. 19A;

DESCRIPTION OF THE PREFERRED EMBODIMENTS

Embodiments of the present invention will be described below in the following order.
1. Schematic Configuration Example of MOS Solid-State Imaging Device
2. Embodiment (Configuration Example and Manufacturing Method Example of Solid-State Imaging Device)
3. Another Embodiment (Configuration Example and Manufacturing Method Example of Solid-State Imaging Device)
4. Still Another Embodiment (Configuration Example of Solid-State Imaging Device)
5. Yet Another Embodiment (Configuration Example of Solid-State Imaging Device)
6. Yet Another Embodiment (Configuration Example of Electronic Device)

1. Schematic Configuration Example of CMOS Solid-State Imaging Device

Figure 16:
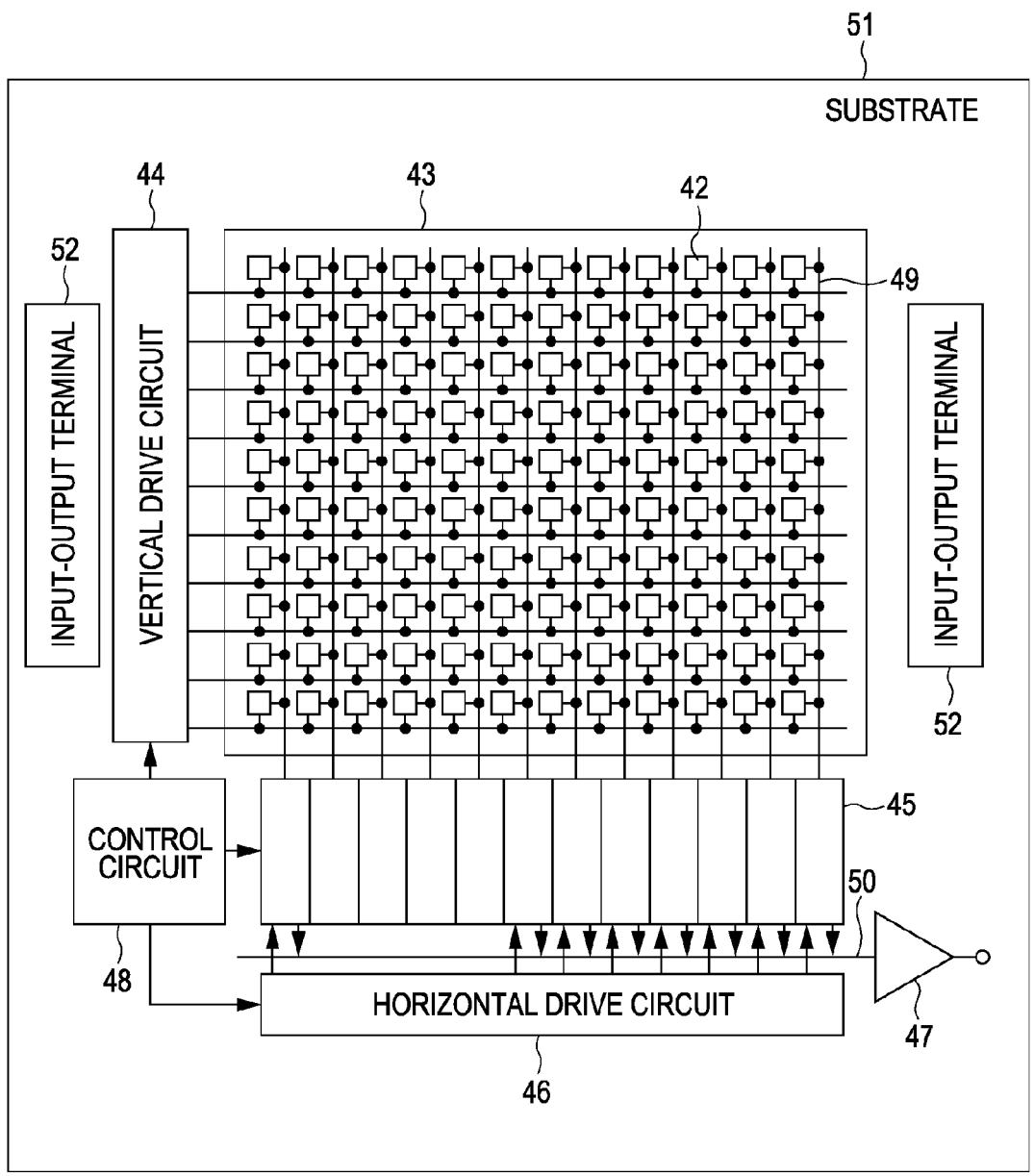
FIG. 16 schematically illustrates the configuration of an example of a CMOS solid-state imaging device which is applied to the embodiments of the present invention.

FIG. 16 illustrates an example of the schematic configuration of a MOS solid-state imaging device according to embodiments of the present invention. A solid-state imaging device 41 according to the embodiments of the present invention is configured to include a pixel region (that is, an imaging region) 43 and a peripheral circuit portion on a semiconductor substrate 51 which is a silicon substrate, for example, as shown in FIG. 16. In the pixel region 43, a plurality of pixels 42 including a photoelectric conversion portion are two-dimensionally arranged in a regular manner. As the pixels 42, a unit pixel composed of a single photoelectric conversion unit and a plurality of pixel transistors is applicable. Further, to the pixels 42, a so-called pixel sharing structure in which a plurality of photoelectric conversion portions share pixel-transistors other than a transfer transistor and share a floating diffusion is applicable. The plurality of pixel transistors may have the three-transistor configuration or the four-transistor configuration, as mentioned above.

The peripheral circuit portion includes a vertical drive circuit 44, column signal processing circuits 45, a horizontal drive circuit 46, an output circuit 47, a control circuit 48, and the like.

The control circuit 48 receives an input clock and data for a command of an operational mode and outputs internal information of the solid-state imaging device. That is, the control circuit 48 produces a clock signal and a control signal used as a reference of operations of the vertical drive circuit 44, the column signal processing circuits 45, the horizontal drive circuit 46, and the like, based on a vertical synchronizing signal, a horizontal synchronizing signal, and a master clock. Then the control circuit 48 inputs these signals into the vertical drive circuit 44, the column signal processing circuits 45, the horizontal drive circuit 46, and the like.

The vertical drive circuit 44 is composed of a shift register, for example. The vertical drive circuit 44 selects a pixel drive wiring and supplies a pulse for driving a pixel to the selected pixel drive wiring so as to drive a pixel row by row. That is, the vertical drive circuit 44 selectively scans each of the pixels 42 in the pixel region 43 in a vertical direction in sequence. Then the vertical drive circuit 44 supplies the column signal processing circuits 45 with a pixel signal that is based on a signal charge, which is produced in a photo diode, for example, constituting a photoelectric conversion element of each of the pixels 42 in accordance with an amount of received light, through a vertical signal line 49.

The column signal processing circuits 45 are disposed in a manner corresponding to respective columns of the pixels 42, for example. Each of the column signal processing circuits 45 performs signal processing such as noise removal with respect to a signal outputted from the pixels 42 of one row, for every pixel column. That is, the column signal processing circuits 45 perform signal processing such as CDS for removing fixed pattern noise which is specific to the pixels 42, signal amplification, and AD conversion. On an output stage of the column signal processing circuits 45, a horizontal selection switch (not shown) is provided in a connecting manner with a horizontal signal line 50.

The horizontal drive circuit 46 is composed of a shift register, for example. The horizontal drive circuit 46 sequentially outputs a horizontal scanning pulse so as to select each of the column signal processing circuits 45 in sequence, thus permitting each of the column signal processing circuits 45 to output a pixel signal to the horizontal signal line 50.

The output circuit 47 performs signal processing with respect to a signal which is sequentially outputted from each of the column signal processing circuits 45 through the horizontal signal line 50 so as to output the signal. The output circuit 47 may perform only buffering, or perform black-level control, column-variation correction, and various digital signal processing, for example. An input-output terminal 52 exchanges signals with the outsides.

2. Embodiment

Configuration Example of Solid-State Imaging Device

Figure 1:
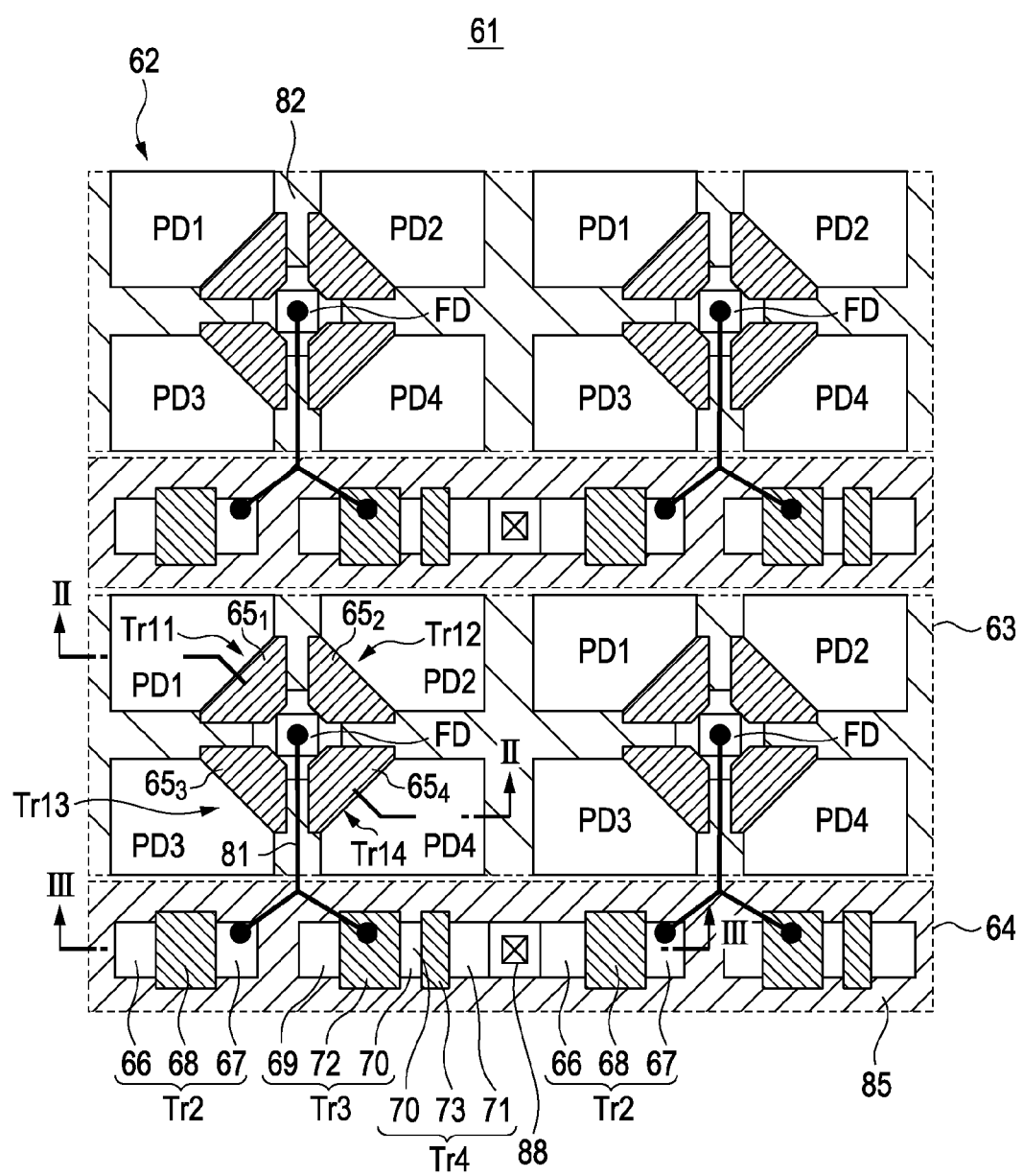
FIG. 1 schematically illustrates the configuration of a chief part of a pixel region of a solid-state imaging device according to an embodiment of the present invention.
Figure 2:
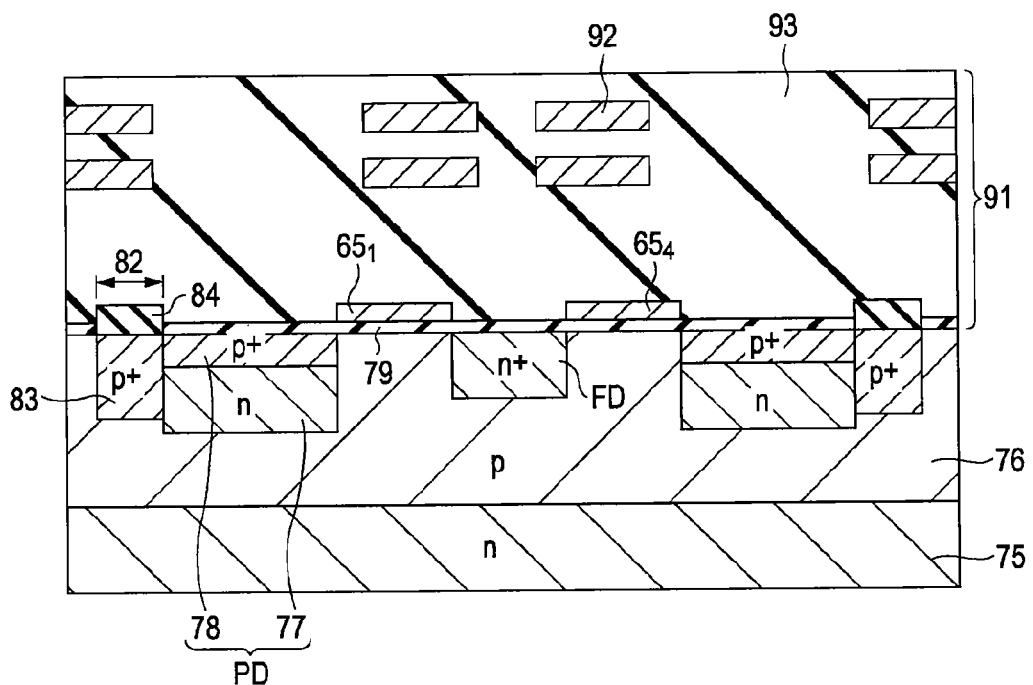
FIG. 2 is a sectional view taken along a II-II line of FIG. 1.
Figure 3:
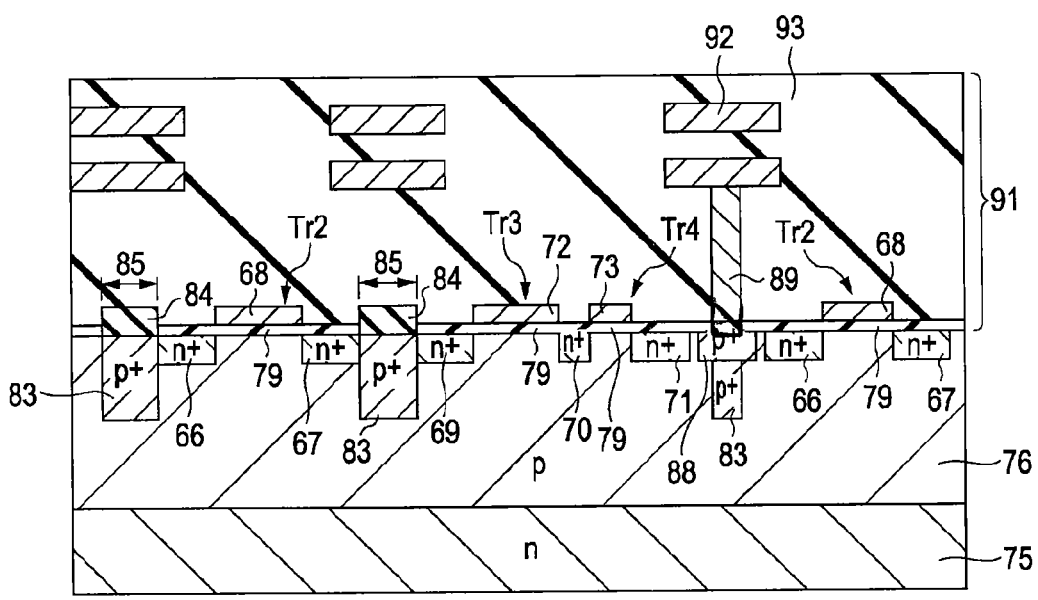
FIG. 3 is a sectional view taken along a III-III line of FIG. 1.

FIGS. 1 to 3 illustrate the schematic configuration of a solid-state imaging device according to an embodiment of the present invention. The solid-state imaging device of the embodiment is a CMOS solid-state imaging device and is applied to a four-pixel sharing solid-state imaging device. FIG. 1 is a plan view schematically showing a chief part of a pixel region. FIG. 2 is a sectional view taken along a II-II line of FIG. 1. FIG. 3 is a sectional view taken along a III-III line of FIG. 1.

A solid-state imaging device 61 according to the embodiment includes a pixel region 62 in which single sharing units are arranged in a two-dimensional array fashion. Each of the single sharing units is composed of photodiodes PD [PD1 to PD4] of four pixels arranged two pixels in width and two pixels in length (that is, four-pixel sharing). In a single sharing unit, one floating diffusion portion FD is shared by the four photodiodes PD [PD1 to PD4]. Pixel transistors are four transfer transistors Tr1 [Tr11 to Tr14], and one reset transistor Tr2, one amplification transistor Tr3, and one selection transistor Tr4 which are shared. An equivalent circuit of the four-pixel sharing configuration will be described later (refer to FIG. 17).

The floating diffusion portion FD is disposed at the center surrounded by the four photodiodes PD1 to PD4. The transfer transistors Tr11 to Tr14 respectively include the floating diffusion portion FD shared thereby and transfer gate electrodes 65 [$65_1$ to $65_4$] which are respectively disposed between the floating diffusion portion FD and the corresponding photodiodes PD.

Here, a region including the photodiodes PD1 to PD4, the floating diffusion portion FD, and the transfer transistors Tr11 to Tr14 of a sharing unit in each row is defined as a photodiode forming region 63. Further, a region including the reset transistor Tr2, the amplification transistor Tr3, and the selection transistor Tr4, which are shared by four pixels, among the pixel transistors of the sharing unit in each row is defined as a transistor forming region 64. The transistor forming regions 64 and the photodiode forming regions 63 which continue in the horizontal direction are arranged alternately in the vertical direction of the pixel region 62.

The reset transistor Tr2 is composed of a pair of source/drain regions 66 and 67 and a reset gate electrode 68. The amplification transistor Tr3 is composed of a pair of source/drain regions 69 and 70 and an amplification gate electrode 72. The selection transistor Tr4 is composed of a pair of source/drain regions 70 and 71 and a selection gate electrode 73.

These photodiodes PD and pixel transistors (Tr1 to Tr4) are formed on a semiconductor well region 76 formed on a semiconductor substrate 75 as shown in sectional views of FIGS. 2 and 3. That is, a second-conductivity-type semiconductor substrate which is, for example, an n-type semiconductor substrate is used as the semiconductor substrate 75. A first-conductivity-type semiconductor well region which is, for example, the p-type semiconductor well region 76 is formed on the semiconductor substrate 75, and the photodiodes PD and the pixel transistors Tr1 to Tr4 mentioned above are formed on the p-type semiconductor well region 76. Each of the photodiodes PD is composed of an n-type semiconductor region 77 and a p-type semiconductor region 78 which is formed on a surface of the n-type semiconductor region 77 and has a high impurity concentration. The transfer transistors Tr11 to Tr14 respectively include the transfer gate electrodes 65 [$65_1$ to $65_4$] which are respectively formed between the floating diffusion portion FD, which is shared and is an n-type semiconductor region, and the photodiodes PD1 to PD4 with a gate insulation film 79 interposed (refer to FIG. 2).

The reset transistor Tr2 is composed of the pair of n-type source/drain regions 66 and 67 and the reset gate electrode 68 with the gate insulation film 79 interposed. The amplification transistor Tr3 is composed of the pair of n-type source/drain regions 69 and 70 and the amplification gate electrode 72 with the gate insulation film 79 interposed. The selection transistor Tr4 is composed of the pair of n-type source/drain regions 70 and 71 and the selection gate electrode 73 with the gate insulation film 79 interposed (refer to FIG. 3).

The floating diffusion portion FD is coupled to one region 67 of the source/drain regions of the reset transistor Tr2 and the amplification gate electrode 72 through a connecting wiring 81.

Figure 17:
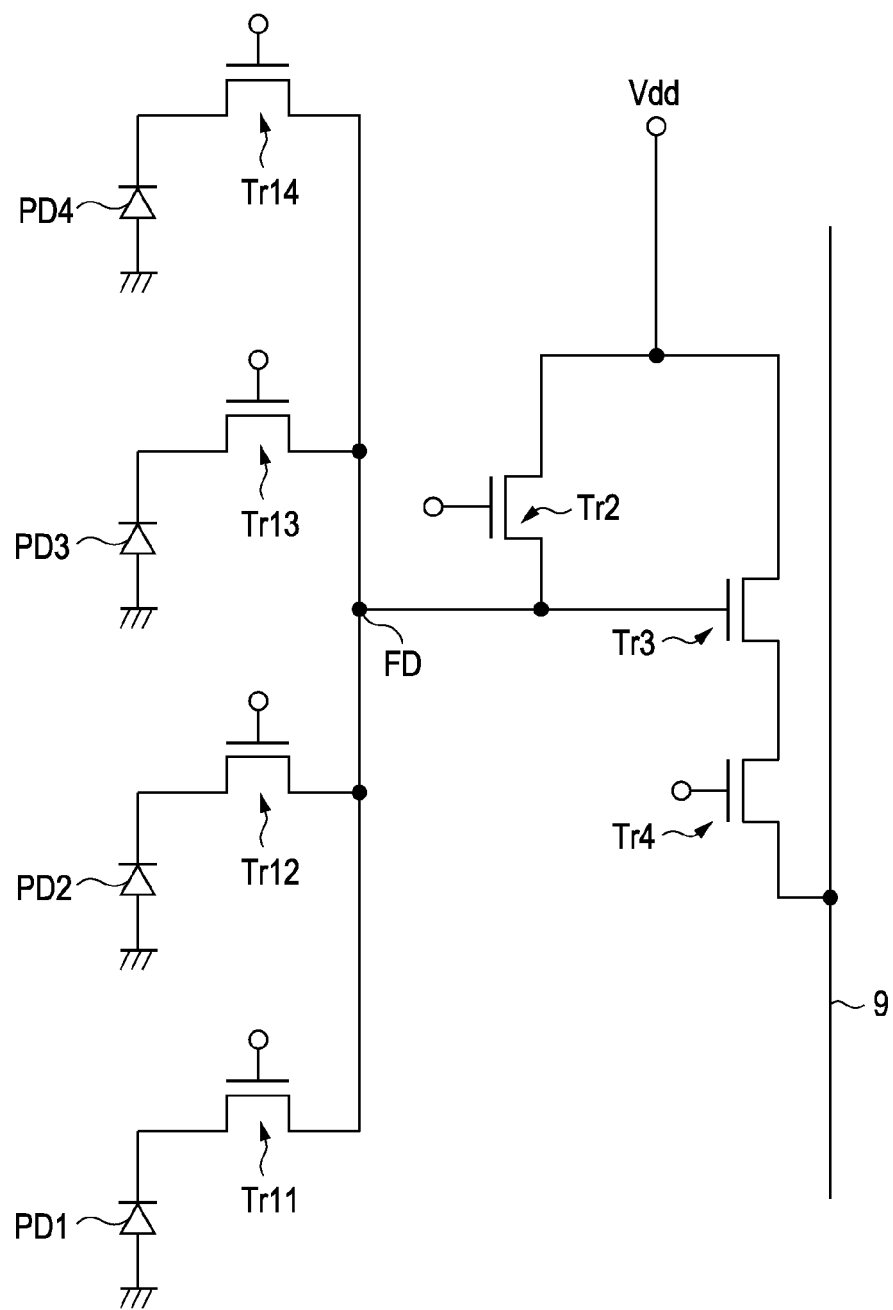
FIG. 17 illustrates an equivalent circuit of a four-pixel sharing configuration.

FIG. 17 illustrates an equivalent circuit of the four-pixel sharing configuration. In the equivalent circuit of the four-pixel sharing configuration, four photodiodes PD [PD1 to PD4] are respectively coupled to sources of the four transfer transistors Tr11 to Tr14. A drain of each of the transfer transistors Tr11 to Tr14 is coupled to a source of one reset transistor Tr2. The drain of each of the transfer transistors Tr11 to Tr14 corresponds to the floating diffusion portion FD which is shared. The floating diffusion portion FD is coupled to a gate of the amplification transistor Tr3. A source of the amplification transistor Tr3 is coupled to a drain of the selection transistor Tr4. A drain of the reset transistor Tr2 and a drain of the amplification transistor Tr3 are coupled to a power source Vdd. A source of the selection transistor Tr4 is coupled to a vertical signal line 9.

On the other hand, an element isolation region 82 is formed in the photodiode forming region 63 of the pixel region 62, and an element isolation region 85 is formed in a region, other than the photodiode forming region 63, including the transistor forming region 64 of the pixel region 62. The element isolation region 82 in the photodiode forming region 63 includes a p-type semiconductor region 83 which is an impurity diffusion region and an insulation film (for example, a silicon oxide film) 84 formed on a surface of the p-type semiconductor region 83 in the embodiment. The element isolation region 85 in the region including the transistor forming region 64 also includes the p-type semiconductor region 83 and the insulation film 84 formed on the surface of the p-type semiconductor region 83 in the embodiment. That is, the element isolation region 85 provided in a region between pixel transistors adjacent to each other and in the transistor forming region 64 including the periphery of the pixel transistors is composed of the p-type semiconductor region 83 and the insulation film 84. An element isolation region 87 provided between the pixel region and the peripheral circuit portion and in the peripheral circuit portion has the STI structure in which an insulation film (for example, a silicon oxide film) 86 is embedded in a groove (refer to FIG. 4).

In the embodiment, a well contact region 88 to be a well contact portion is formed in the transistor forming region 64. The well contact region 88 is used for applying a fixed voltage to the p-type semiconductor well region 76. The element isolation region 85 below the well contact region 88 is composed only of the p-type semiconductor region 83. The well contact region 88 is composed of a p-type semiconductor region which is an impurity diffusion region. The well contact region 88 is composed of a p-type semiconductor region which has higher impurity concentration than the p-type semiconductor region 83, and is formed on the surface of the element isolation region 85 which is composed only of the p-type semiconductor region 83. The well contact region 88 serves also as an element isolation region and is formed between pixel transistors of adjacent sharing units. In other words, an element isolation region having no insulation film serves as the well contact portion as well. The well contact region 88 is coupled to a desired wiring 92 of a multilayer wiring layer 91 through a conductive via 89. A desired fixed voltage is applied from the wiring 92 through the conductive via 89 and the well contact region 88 to the p-type semiconductor well region 76. The multilayer wiring layer 91 is formed by disposing the wirings 92 of a plurality of layers with an interlayer insulation film 93 interposed (refer to FIG. 3). On the multilayer wiring layer 91, an on-chip color filter and an on-chip micro-lens are formed with a planarization film interposed, though they are not shown.

[Manufacturing Method Example of Solid-State Imaging Device]

A method for manufacturing the solid-state imaging device 61 according to the embodiment of the present invention will be schematically described with reference to FIGS. 4 to 8. FIGS. 4 to 8 schematically illustrate the region 63 for the photodiodes PD, the region 64 for the pixel transistors Tr2 to Tr4, and a region 97 for a p-channel transistor of the peripheral circuit. The region 63 includes the floating diffusion portion FD.

Figure 4:
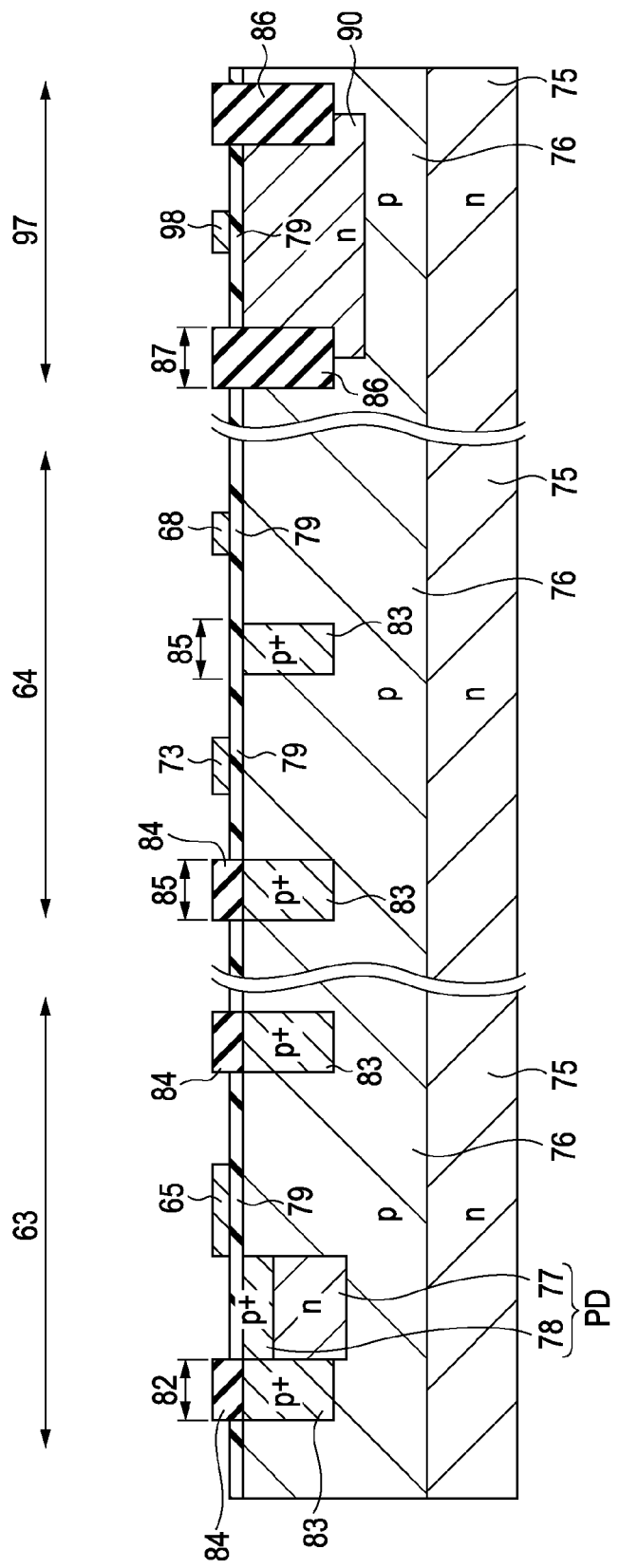
FIG. 4 illustrates a manufacturing process of a method for manufacturing a solid-state imaging device according to the embodiment (1)

First, an element isolation region is formed on a surface of the n-type semiconductor substrate 75 as shown in FIG. 4. That is, the element isolation region 87 having the STI structure in which the insulation film 86 (for example, a silicon oxide film) is embedded in a groove is formed at a peripheral circuit side (the region 97). In the photodiode forming region 63 and the transistor forming region 64 at a pixel region side, the insulation film 84 of the element isolation regions 82 and 85 which are composed of the p-type semiconductor region 83 and the insulation film 84 is formed. Next, the p-type semiconductor well region 76 is formed on the whole region, which corresponds to the pixel region (the regions 63 and 64) and the peripheral circuit portion (the region 97 in the drawing), of the n-type semiconductor substrate 75. The n-type semiconductor well region 90 is formed in the region 97 at the peripheral circuit side.

The transfer gate electrode 65 [$65_1$ to $65_4$] is formed on a region, which corresponds to the photodiode forming region 63, of the p-type semiconductor well region 76 with the gate insulation film 79 interposed. The reset gate electrode 68, the amplification gate electrode 72, and the selection gate electrode 73 are formed on a region, which corresponds to the transistor forming region 64, of the p-type semiconductor well region 76 with the gate insulation film 79 interposed. Here, FIG. 4 shows only the selection gate electrode 73 and the reset gate electrode 68 which are adjacent to each other in adjacent sharing units.

A gate electrode 98 for a p-channel MOS transistor is formed on the n-type semiconductor well region 90 corresponding to the region 97 for a p-channel MOS transistor of the peripheral circuit portion, with the gate insulation film 79 interposed. Though it is not shown, a gate electrode for an n-channel MOS transistor is formed on a p-type semiconductor well region corresponding to a forming region for the n-channel MOS transistor of the peripheral circuit portion with a gate insulation film interposed, at the same time.

Before and after the process for forming each of the gate electrodes 65 [$65_1$ to $65_4$], 68, 72, 73, and 98, impurity ion implantation for forming the photodiode PD is performed. By this previous and following ion implantation, the n-type semiconductor region 77 and the p-type semiconductor region 78 on a surface of the n-type semiconductor region 77 are formed and thus the photodiode PD is formed. Further, before or after the process for forming each of the gate electrodes 65 [$65_1$ to $65_4$], 68, 72, 73, and 98, p-type impurity is ion-implanted through the insulation film 84 constituting the element isolation region 82 at the pixel region side (the regions 63 and 64) so as to form the p-type semiconductor region 83. The element isolation regions 82 and 85 are composed of the p-type semiconductor region 83 and the insulation film 84 formed on the p-type semiconductor region 83. Meanwhile, by this p-type impurity ion implantation, the p-type semiconductor region 83 to be the element isolation region 85 is formed at the same time in a region in which the well contact portion is to be formed. The element isolation region 85 for forming the well contact portion is composed only of the p-type semiconductor region 83 without forming the insulation film 84 on the surface of the p-type semiconductor region 83.

Figure 5:
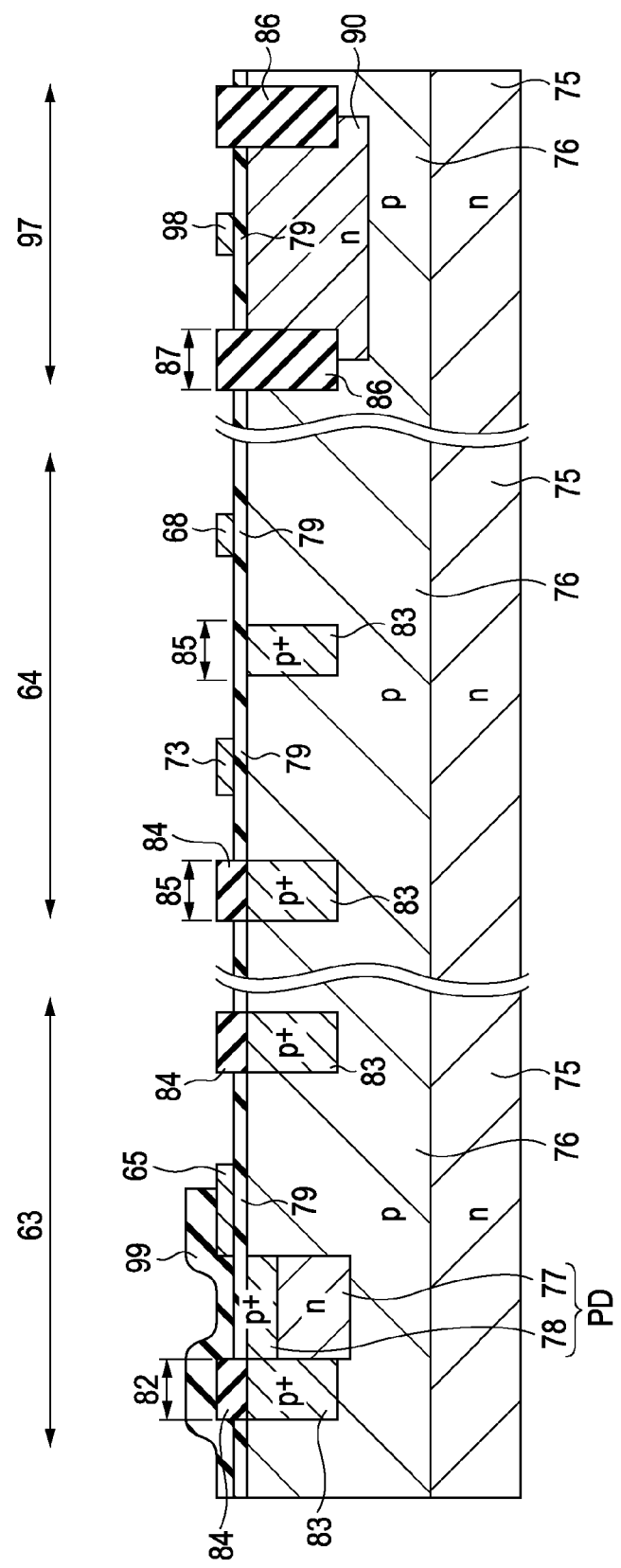
FIG. 5 illustrates a manufacturing process of the method for manufacturing a solid-state imaging device according to the embodiment (2)

Subsequently, a protection film 99 which is a silicon nitride film, for example, is selectively formed in the region 63 for the photodiodes PD, as shown in FIG. 5.

Figure 6:
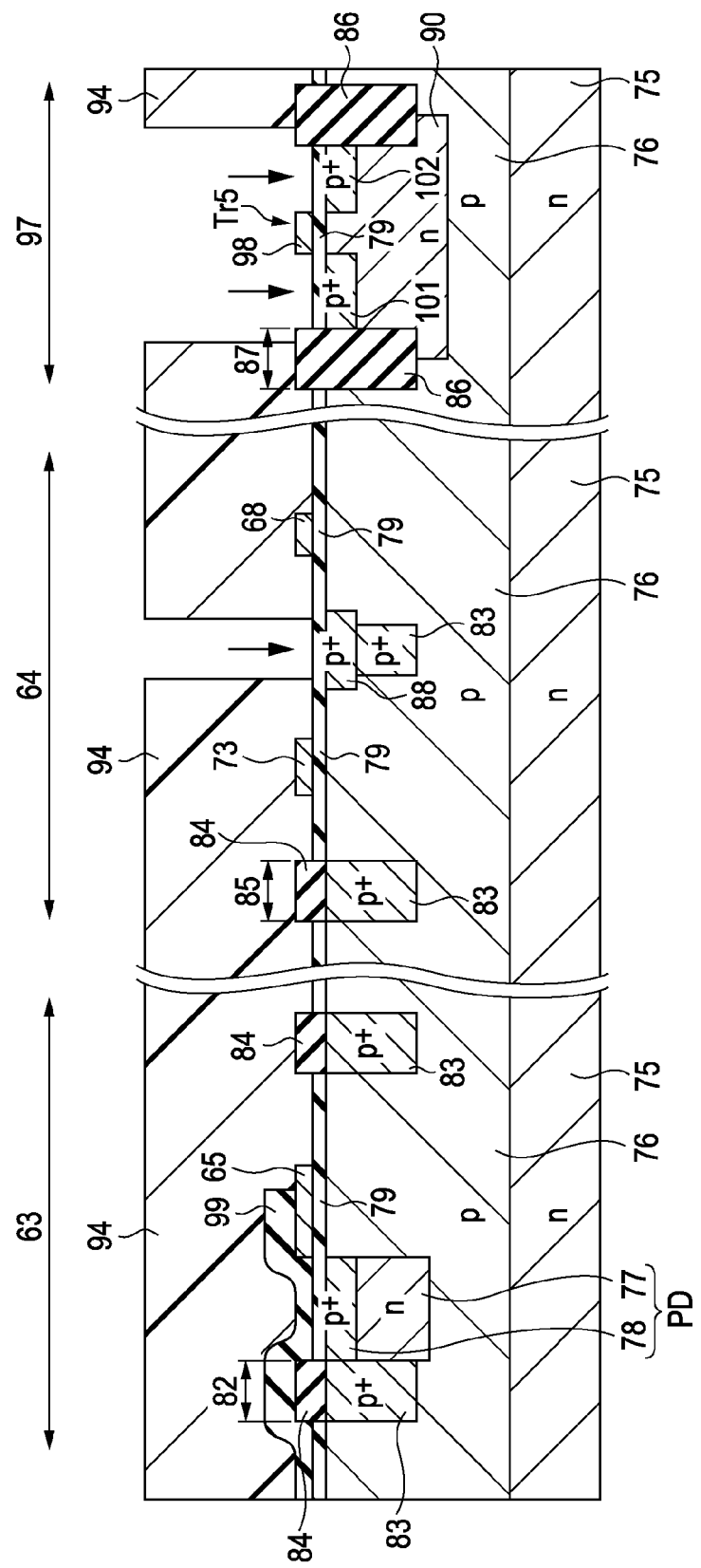
FIG. 6 illustrates a manufacturing process of the method for manufacturing a solid-state imaging device according to the embodiment (3)

Next, p-type impurity 27 is ion-implanted into the region 97 for the peripheral circuit portion through a resist mask 94 so as to form a pair of p-type source/drain regions 101 and 102, forming a p-channel MOS transistor Tr5, as shown in FIG. 6. The well contact region 88 to be the well contact portion is formed at the same time, by this ion implantation of the p-type impurity 27. That is, the p-type well contact region 88 is formed by ion-implanting the p-type impurity into the surface of the p-type semiconductor region 83, having no insulation film, of the region 64 for the transistor on the same ion-implantation condition as the ion implantation for the p-type source/drain regions 101 and 102 of the peripheral circuit portion. In the embodiment, the p-type well contact region 88 having high impurity concentration is formed in a region, which is between the selection transistor Tr4 and the reset transistor Tr2 which are adjacent to each other in adjacent sharing units, of the p-type semiconductor well region 76. The well contact region 88 serves also as the element isolation region and also is a high impurity-concentration region for reducing contact resistance in the contact portion.

Figure 7:
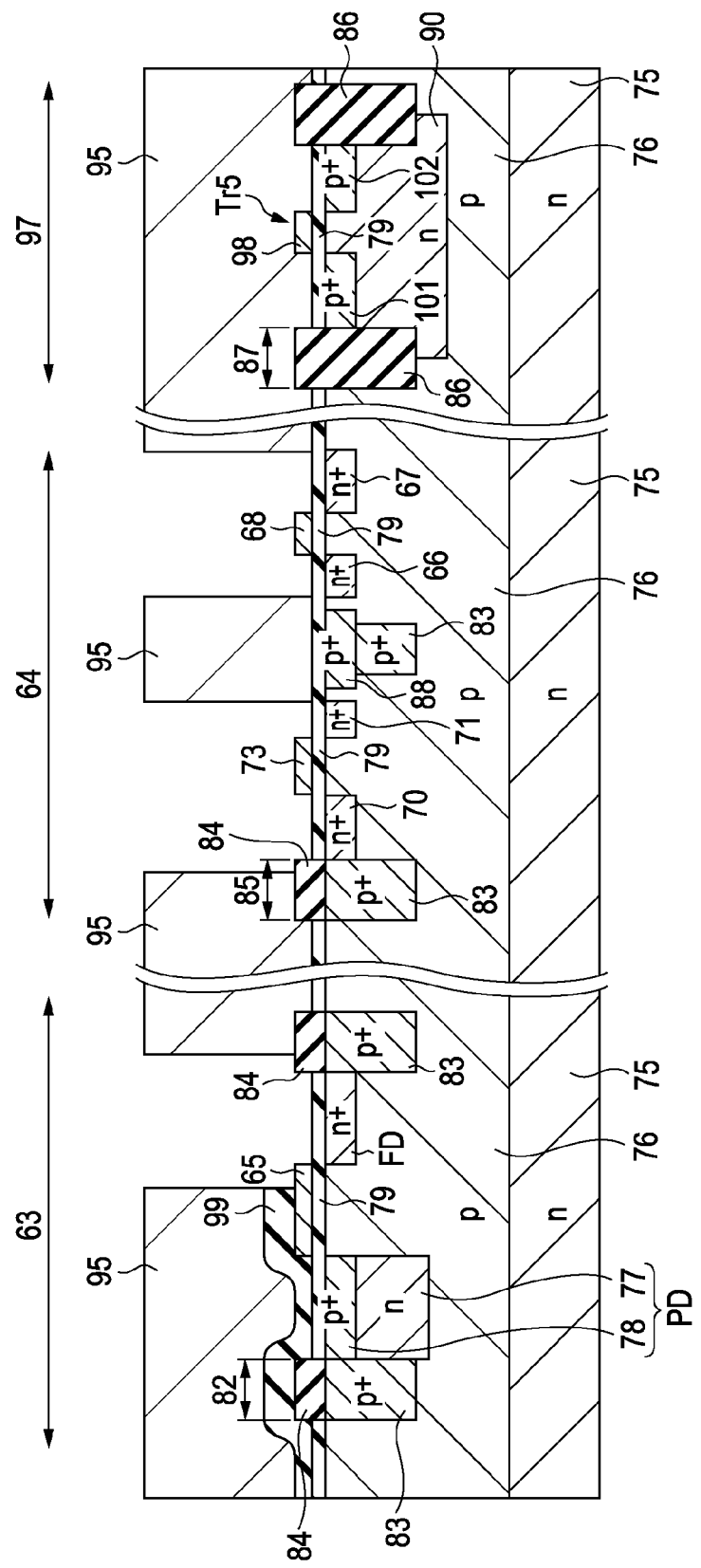
FIG. 7 illustrates a manufacturing process of the method for manufacturing a solid-state imaging device according to the embodiment (4)

Next, n-type impurity is ion-implanted while using a resist mask 95 and the gate electrodes 65 [$65_1$ to $65_4$], 68, 72, and 73 as a mask so as to form each of the n-type source/drain regions 66, 67, 69, 70, and 71 including the n-type floating diffusion portion FD, as shown in FIG. 7.

Figure 8:
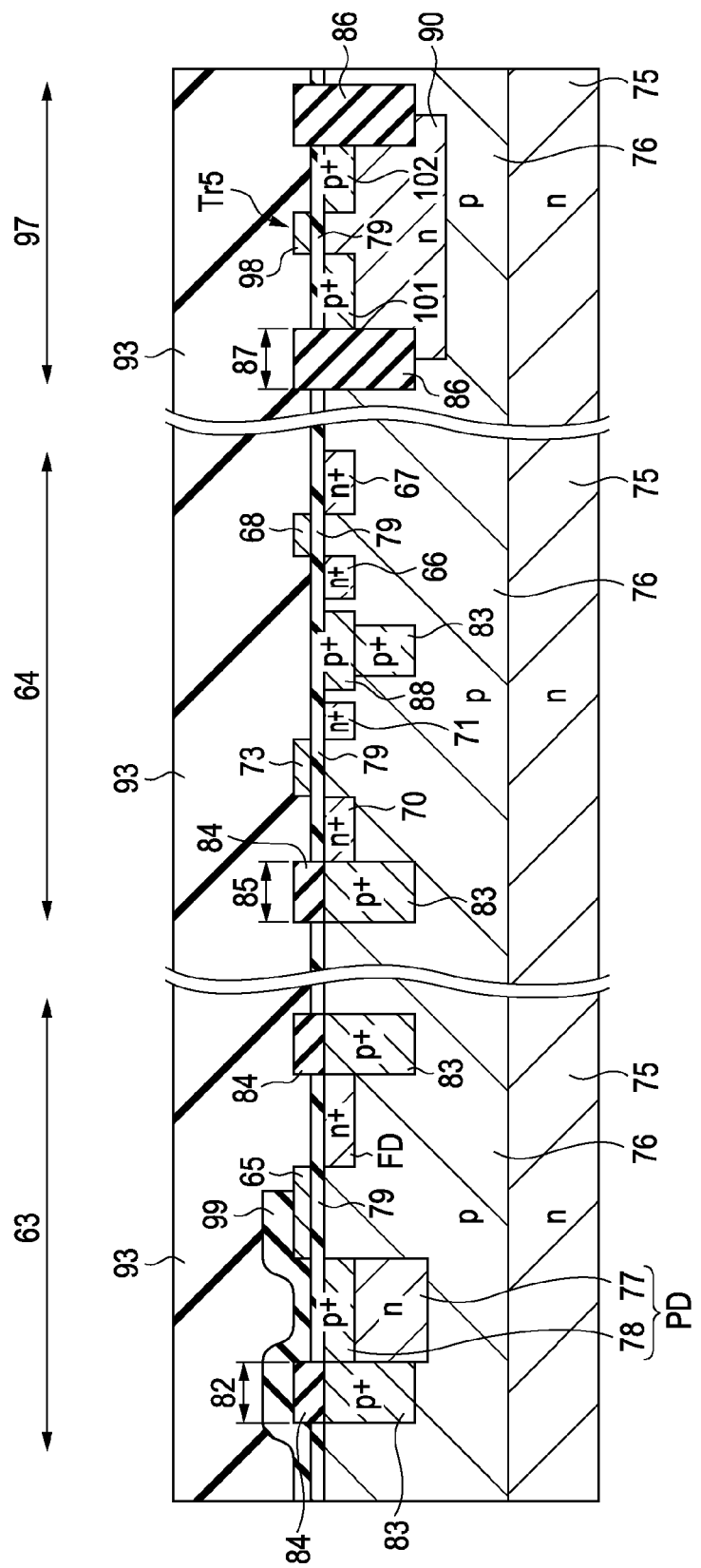
FIG. 8 illustrates a manufacturing process of the method for manufacturing a solid-state imaging device according to the embodiment (5)

Subsequently, the interlayer insulation film 93 is formed on the substrate, as shown in FIG. 8. The interlayer insulation film 93 is an interlayer film used in forming wirings of a plurality of layers.

Figure 9:
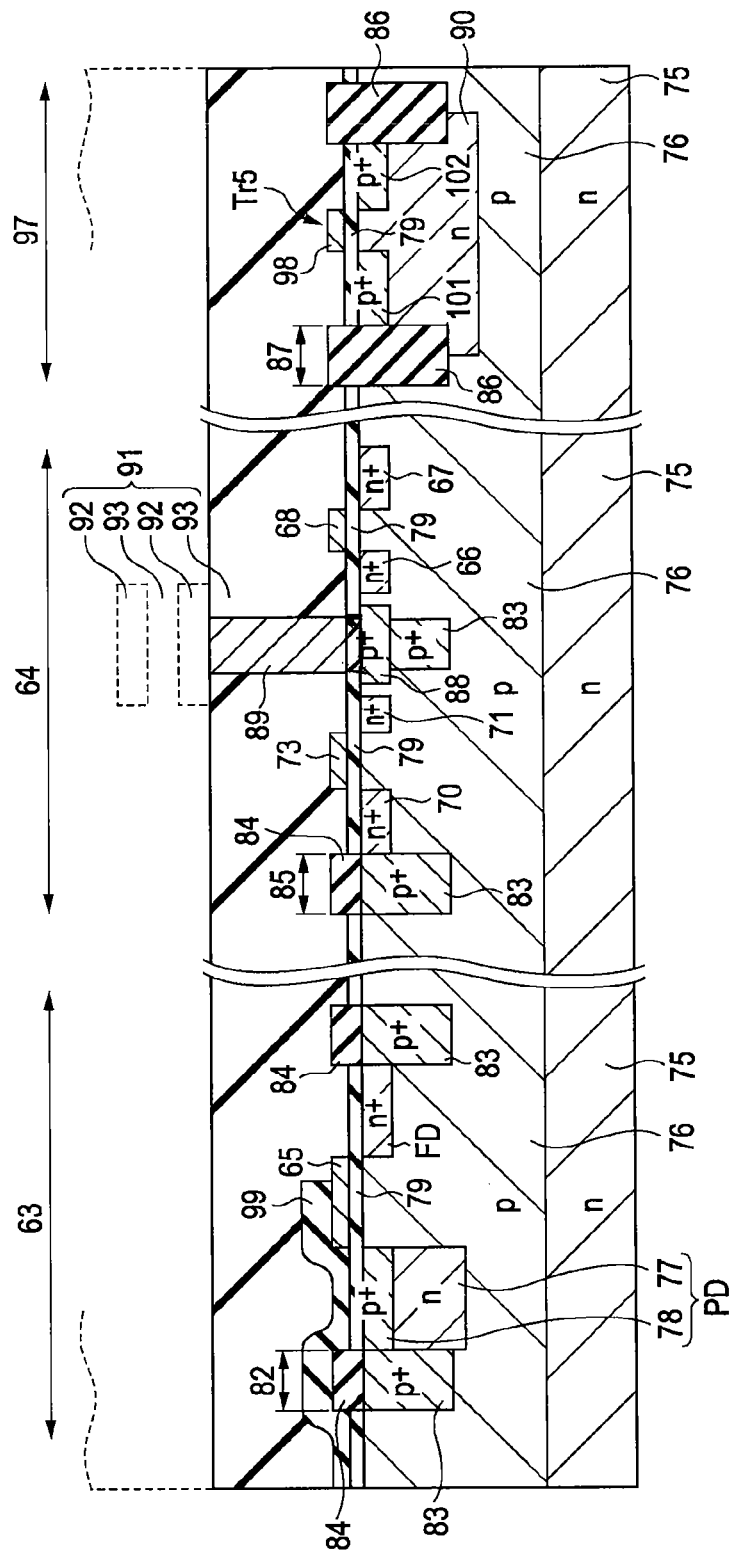
FIG. 9 illustrates a manufacturing process of the method for manufacturing a solid-state imaging device according to the embodiment (6)

Next, as shown in FIG. 9, a contact hall is formed in the interlayer insulation film 93 so as to embed the conductive via 89, which is coupled with the well contact region 88, in the contact hall. After that, the wirings 92 and the interlayer insulation films 93 are formed in a multilayer fashion so as to form the multilayer wiring layer 91. The well contact region 88 is coupled with the desired wiring 92 through the conductive via 89. Further, a planarization film, an on-chip color filter, and an on-chip micro-lens are formed on the multilayer wiring layer 91, though they are not shown. Thus, the solid-state imaging device 61 is manufactured.

According to the solid-state imaging device 61 of the embodiment, the well contact region 88 is not formed in the region between the photodiodes PD but is formed in the transistor forming region 64, namely, between adjacent pixel transistors in adjacent sharing units. That is, the element isolation region 85 having no insulation film and positioned between desired pixel transistors is composed only of the p-type semiconductor region 83, and the p-type well contact region 88 having high impurity concentration and serving also as the element isolation region 85 is formed on the surface of the p-type semiconductor region 83. In other words, the element isolation region 85 having no insulation film and positioned between the desired pixel transistors serves also as the well contact portion.

Under favor of this configuration, the well contact region 88 does not adversely affect the photodiode PD and accordingly a pixel characteristic can be improved. Since the well contact region 88 is formed in the transistor forming region 64 and thus the element isolation region having no insulation film is formed, an area occupied by an insulation film of the element isolation region is reduced, being able to suppress occurrence of dark current and white spots for the reduced area and improve the pixel characteristic. Since well potential is supplied to the semiconductor well region 76 through the well contact region 88, well potential in an effective pixel region can be stabilized.

Further, in the manufacturing, the ion implantation for forming the well contact region 88 serves also as the ion implantation of p-type impurity for forming the source/drain regions 101 and 102 of the p-channel transistor in the peripheral circuit portion. Accordingly, the process of the ion implantation is reduced compared to the reference example, being able to reduce the number of manufacturing steps.

3. Another Embodiment

Configuration Example of Solid-State Imaging Device

Figure 10:
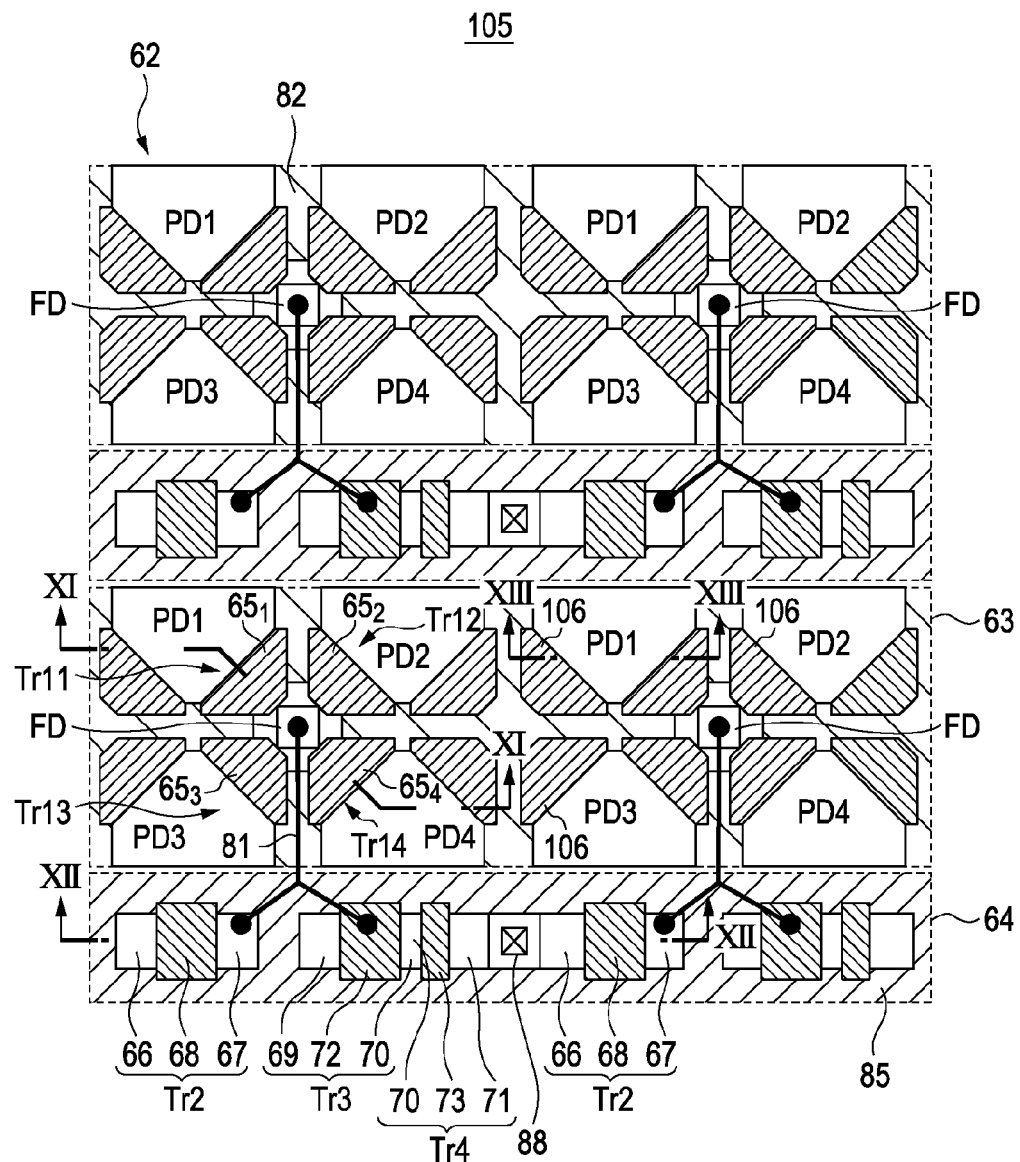
FIG. 10 schematically illustrates the configuration of a chief part of a pixel region of a solid-state imaging device according to another embodiment of the present invention.
Figure 11:
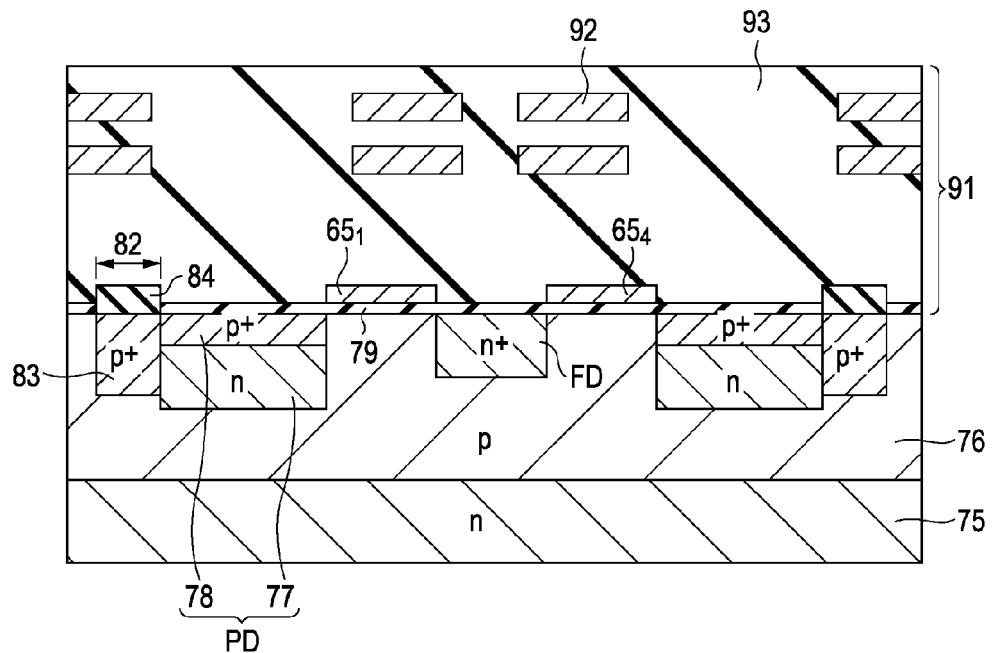
FIG. 11 is a sectional view taken along an XI-XI line of FIG. 10.
Figure 12:
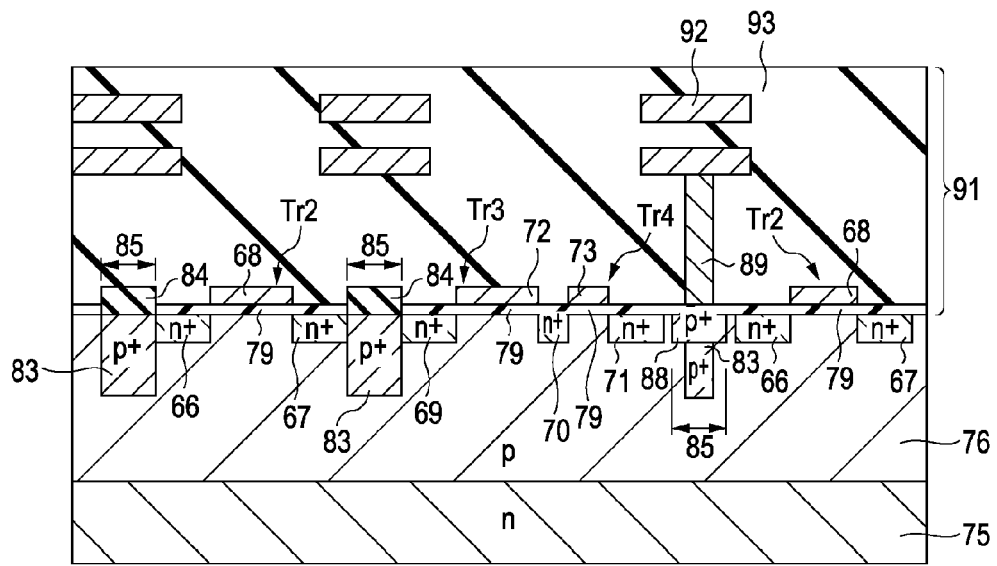
FIG. 12 is a sectional view taken along a XII-XII line of FIG. 10.
Figure 13:
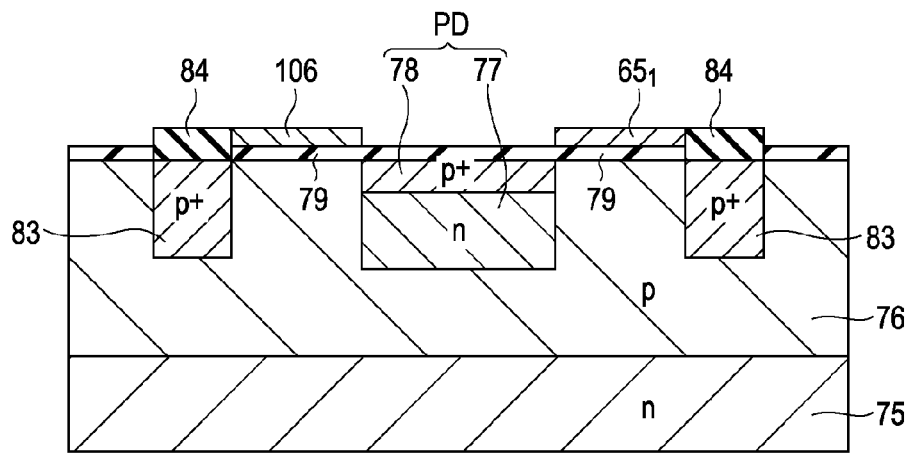
FIG. 13 is a sectional view taken along a XIII-XIII line of FIG. 10.

FIGS. 10 to 13 illustrate a solid-state imaging device according to another embodiment of the present invention. The solid-state imaging device of the other embodiment is a CMOS solid-state imaging device and is applied to a four-pixel sharing solid-state imaging device. FIG. 10 is a plan view schematically showing a chief part of a pixel region. FIG. 11 is a sectional view taken along a XI-XI line of FIG. 10. FIG. 12 is a sectional view taken along a XII-XII line of FIG. 10. FIG. 13 is a sectional view taken along a XIII-XIII line of FIG. 10.

A solid-state imaging device 105 according to the embodiment is a solid-state imaging device similar to that of the embodiment described first except that a dummy electrode opposed to a transfer gate electrode is added in each pixel in every sharing unit. In the embodiment, elements corresponding to those of the embodiment described first are given the same reference characters.

The solid-state imaging device 105 according to the embodiment includes a pixel region 62 in which single sharing units are arranged in a two-dimensional array fashion, in a similar manner to the embodiment described first. Each of the single sharing units is composed of photodiodes PD [PD1 to PD4] of four pixels arranged two pixels in width and two pixels in length (that is, four-pixel sharing). In a single sharing unit, one floating diffusion portion FD is shared by the four photodiodes PD [PD1 to PD4]. Pixel transistors are four transfer transistors Tr1 [Tr11 to Tr14], and one reset transistor Tr2, one amplification transistor Tr3, and one selection transistor Tr4 which are shared.

The floating diffusion portion FD is disposed at the center surrounded by the four photodiodes PD1 to PD4. The transfer transistors Tr11 to Tr14 respectively include the floating diffusion portion FD shared thereby and transfer gate electrodes 65 [$65_1$ to $65_4$] which are respectively disposed between the floating diffusion portion FD and the corresponding photodiodes PD.

In a similar manner to the embodiment described first, a region including the photodiodes PD1 to PD4, the floating diffusion portion FD, and the transfer transistors Tr11 to Tr14 of a sharing unit in each row is defined as a photodiode forming region 63. Further, a region including the reset transistor Tr2, the amplification transistor Tr3, and the selection transistor Tr4, which are shared by four pixels, of the pixel transistors of the sharing unit in each row is defined as a transistor forming region 64. The transistor forming regions 64 and the photodiode forming regions 63 which continue in the horizontal direction are arranged alternately in the vertical direction of the pixel region 62.

The reset transistor Tr2 is composed of a pair of source/drain regions 66 and 67 and a reset gate electrode 68. The amplification transistor Tr3 is composed of a pair of source/drain regions 69 and 70 and an amplification gate electrode 72. The selection transistor Tr4 is composed of a pair of source/drain regions 70 and 71 and a selection gate electrode 73.

These photodiodes PD and pixel transistors (Tr1 to Tr4) are formed on a first-conductivity-type semiconductor well region 76 formed on a semiconductor substrate 75 as shown in sectional views of FIGS. 11 and 12. That is, a second-conductivity-type semiconductor substrate, for example, an n-type semiconductor substrate is used as the semiconductor substrate 75. The first-conductivity-type semiconductor well region which is, for example, the p-type semiconductor well region 76 is formed on the semiconductor substrate 75, and the photodiodes PD and the pixel transistors Tr1 to Tr4 mentioned above are formed on the p-type semiconductor well region 76. Each of the photodiodes PD is composed of an n-type semiconductor region 77 and a p-type semiconductor region 78 which is formed on a surface of the n-type semiconductor region 77 and has a high impurity concentration. The transfer transistors Tr11 to Tr14 respectively include the transfer gate electrodes 65 [$65_1$ to $65_4$] which are respectively formed between the floating diffusion portion FD, which is shared and is an n-type semiconductor region, and the photodiodes PD1 to PD4 with a gate insulation film 79 interposed (refer to FIG. 11).

The reset transistor Tr2 is composed of the pair of n-type source/drain regions 66 and 67 and the reset gate electrode 68 with the gate insulation film 79 interposed. The amplification transistor Tr3 is composed of the pair of n-type source/drain regions 69 and 70 and the amplification gate electrode 72 with the gate insulation film 79 interposed. The selection transistor Tr4 is composed of the pair of n-type source/drain regions 70 and 71 and the selection gate electrode 73 with the gate insulation film 79 interposed (refer to FIG. 12).

The floating diffusion portion FD is coupled to one region 67 of the source/drain regions of the reset transistor Tr2 and the amplification gate electrode 72 through a connecting wiring 81.

On the other hand, element isolation regions 82 and 85 respectively in the photodiode forming region 63 and the transistor forming region 64 are composed of a p-type semiconductor region 83 which is an impurity diffusion region, for example, and an insulation film 84 formed on a surface of the p-type semiconductor region 83. Though it is not shown, an element isolation region provided between the pixel region and the peripheral circuit portion other than the above-mentioned regions and in the peripheral circuit portion has the STI structure, as is the case with the embodiment described first.

In the embodiment, a well contact region 88 to be a well contact portion is formed in the transistor forming region 64. The well contact region 88 is used for applying a fixed voltage to the p-type semiconductor well region 76. The element isolation region 85 below the well contact region 88 is composed only of the p-type semiconductor region 83. The well contact region 88 is composed of a p-type semiconductor region which is an impurity diffusion region. The well contact region 88 is composed of a p-type semiconductor region which has higher impurity concentration than the p-type semiconductor region 83, and is formed on the surface of the element isolation region 85 which is composed only of the p-type semiconductor region 83. The well contact region 88 serves also as an element isolation region and is formed between pixel transistors of adjacent sharing units. In other words, an element isolation region having no insulation film serves as the well contact portion as well. The well contact region 88 is coupled to a desired wiring 92 of a multilayer wiring layer 91 through a conductive via 89. A desired fixed voltage is applied from the wiring 92 through the conductive via 89 and the well contact region 88 to the p-type semiconductor well region 76. The multilayer wiring layer 91 is formed by disposing the wirings 92 of a plurality of layers with an interlayer insulation film 93 interposed (refer to FIG. 12).

Further, in the embodiment, a dummy electrode 106 is disposed in a manner limiting an opening area of each photodiode PD in every sharing unit so as to improve a symmetric property of a pixel. The dummy electrode 106 is formed to have the same or similar size and shape to those of the transfer gate electrode 65 in each photodiode PD and is disposed to be opposed to the transfer gate electrode 65. In FIG. 10, every four dummy electrodes 106 are disposed between groups, which are adjacent to each other in a horizontal direction, of the transfer gate electrodes 65 [$65_1$ to $65_4$]. The every four dummy electrodes 106 are disposed symmetrically to the group of the four transfer gate electrodes 65 [$65_1$ to $65_4$] about a line in a vertical direction (refer to FIGS. 10 and 13). On the multilayer wiring layer 91, an on-chip color filter and an on-chip micro-lens are formed with a planarization film interposed, though they are not shown.

[Manufacturing Method Example of Solid-State Imaging Device]

In a method for manufacturing the solid-state imaging device 105 according to the embodiment, the dummy electrode 106 is simultaneously formed when the transfer gate electrode 65 shown in FIG. 4 according to the embodiment described first is formed. Other steps of the process are same as those described in the method for manufacturing the solid-state imaging device of the embodiment described first, so that overlapping description will be skipped.

In the solid-state imaging device 105 according to the embodiment, the well contact region 88 is formed in the transistor forming region 64, namely, between adjacent pixel transistors of adjacent sharing units in the embodiment, in a similar manner to the embodiment described first. Accordingly, the well contact region 88 does not adversely affect the photodiode PD and therefore a pixel characteristic can be improved. Since the well contact region 88 is formed in the transistor forming region 64 and thus the element isolation region having no insulation film is formed, an area occupied by an insulation film of the element isolation region is reduced, being able to suppress occurrence of dark current and white spots for the reduced area and improve the pixel characteristic. Since well potential is supplied to the semiconductor well region 76 through the well contact region 88, well potential in an effective pixel region can be stabilized.

Figure 19A:
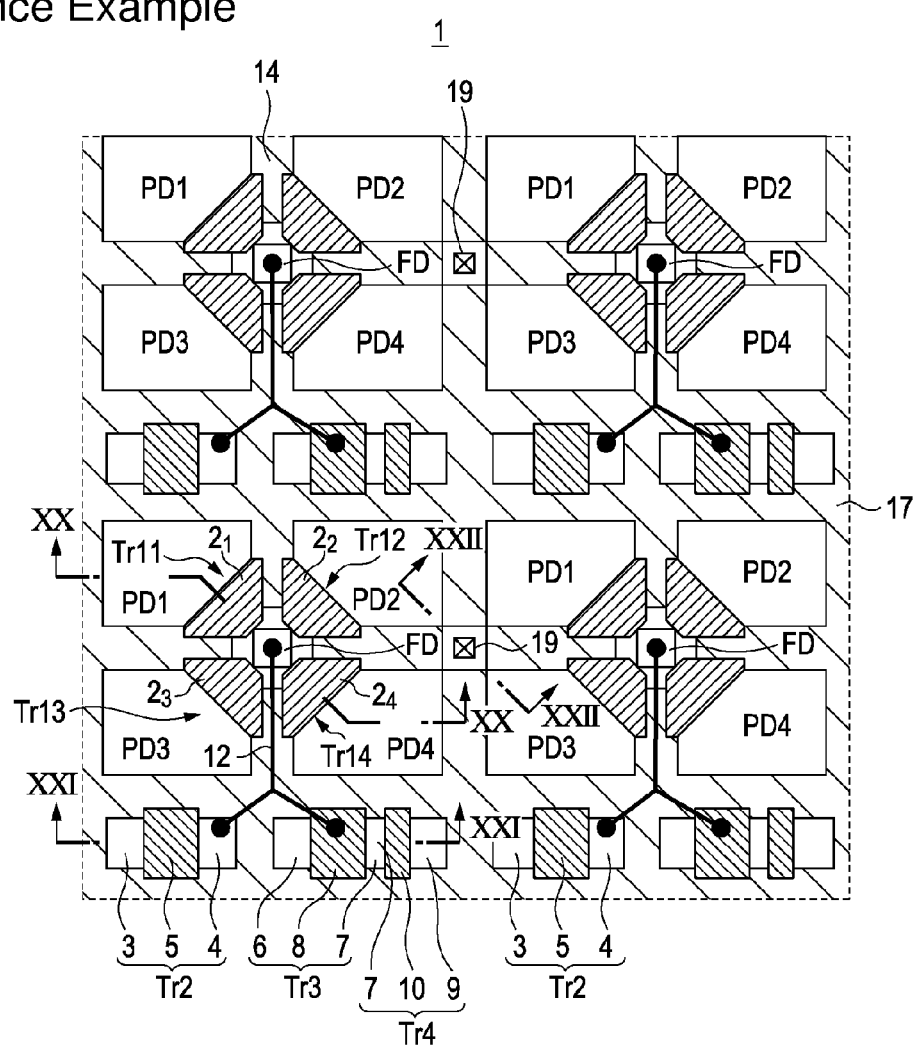
FIG. 19A schematically illustrates the configuration of a chief part of a pixel region of a solid-state imaging device according to a reference example.
Figure 19B:
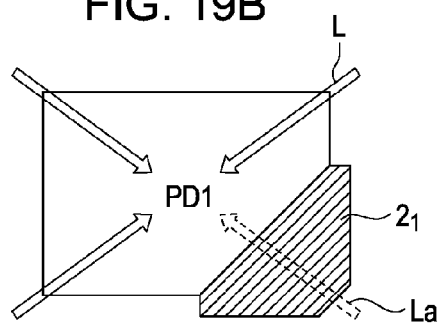
FIG. 19B is a schematic view showing a state of light incident on a photodiode.
Figure 22:
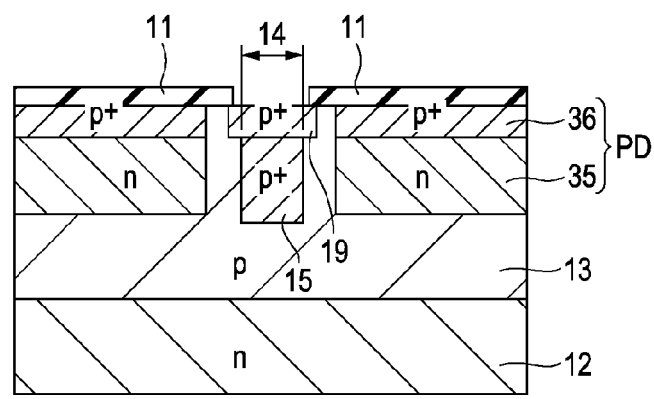
FIG. 22 is a sectional view taken along a XXII-XXII line of FIG. 19A.
Figure 23:
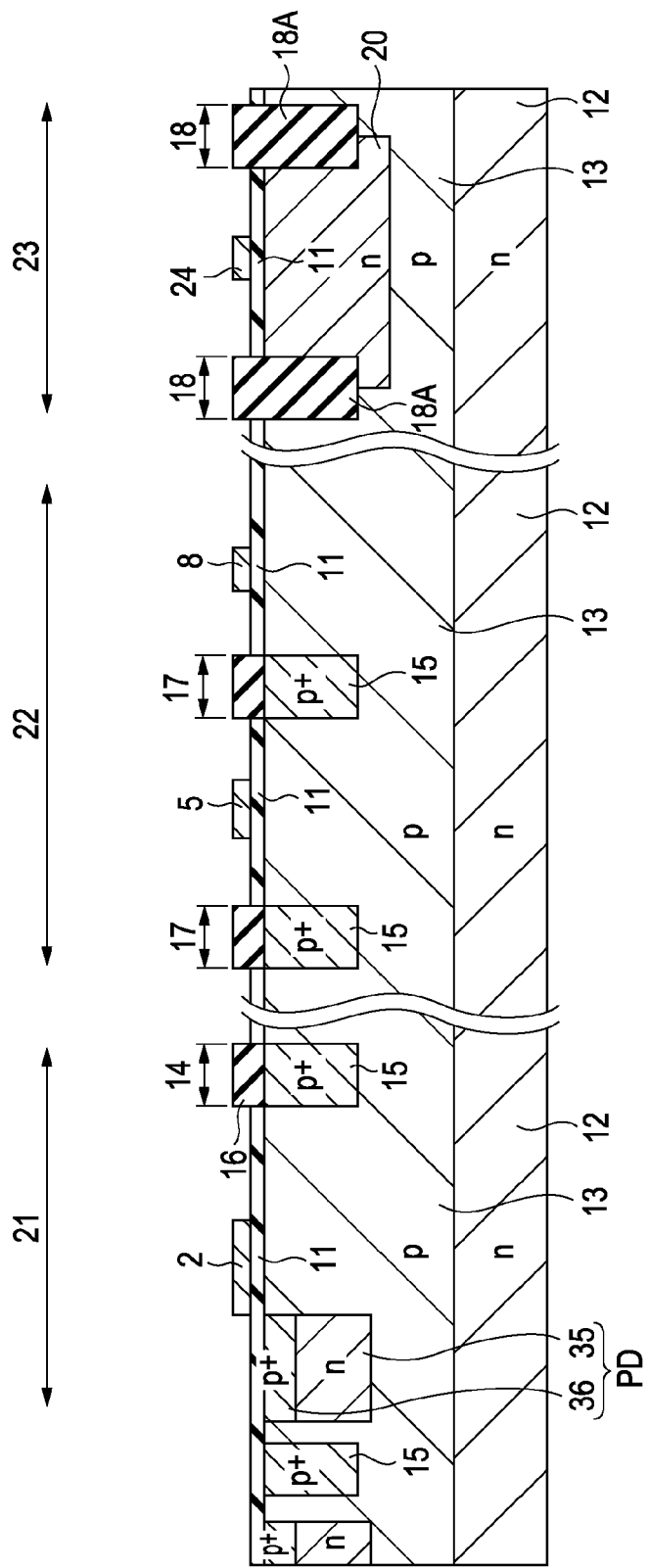
FIG. 23 illustrates a manufacturing process of a method for manufacturing a solid-state imaging device according to the reference example (1)
Figure 24:
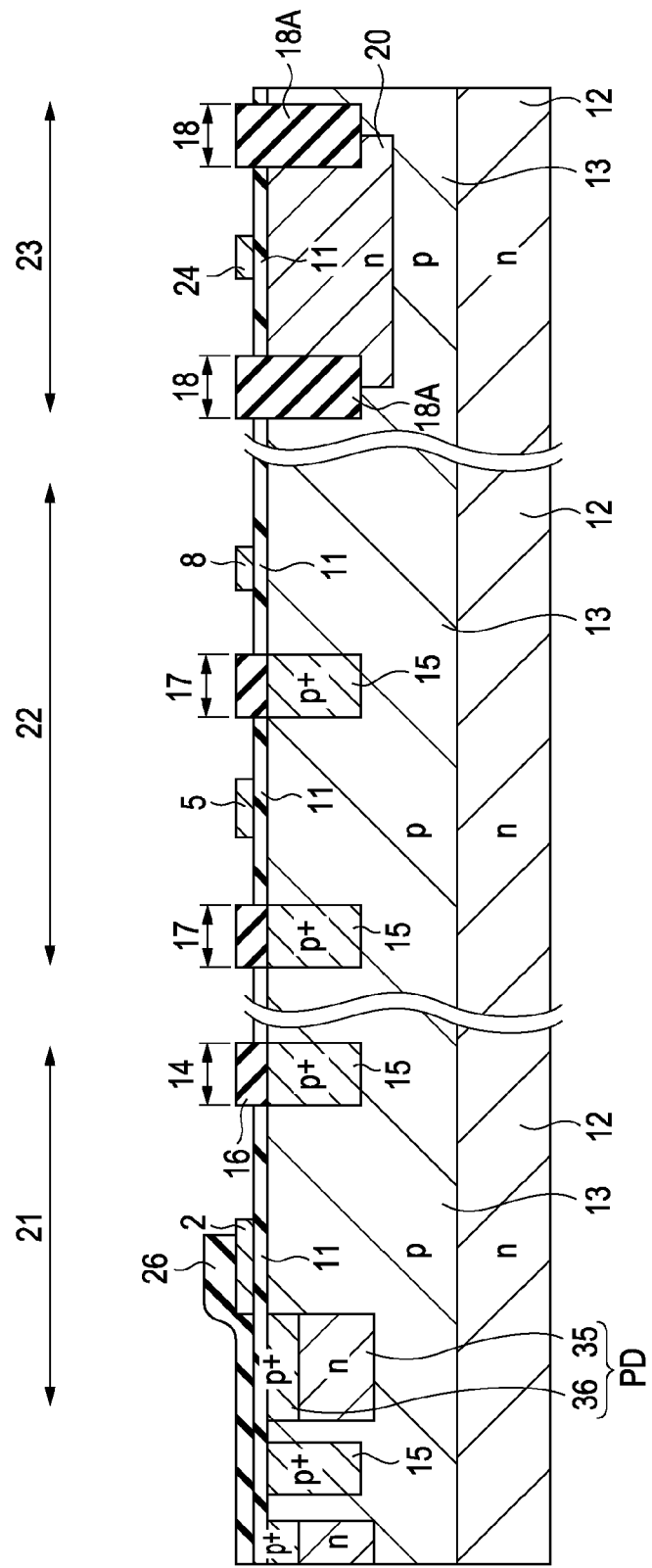
FIG. 24 illustrates a manufacturing process of the method for manufacturing a solid-state imaging device according to the reference example (2)
Figure 25:
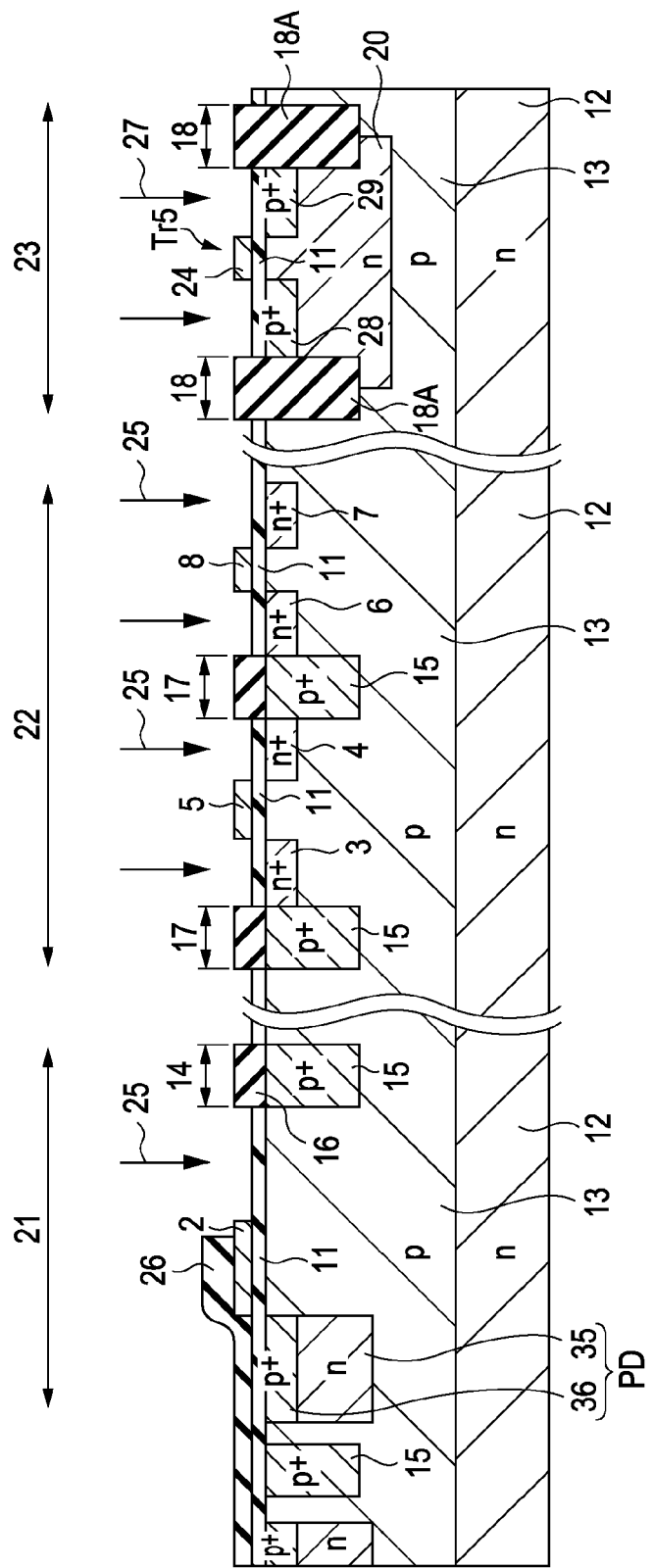
FIG. 25 illustrates a manufacturing process of the method for manufacturing a solid-state imaging device according to the reference example (3)
Figure 26:
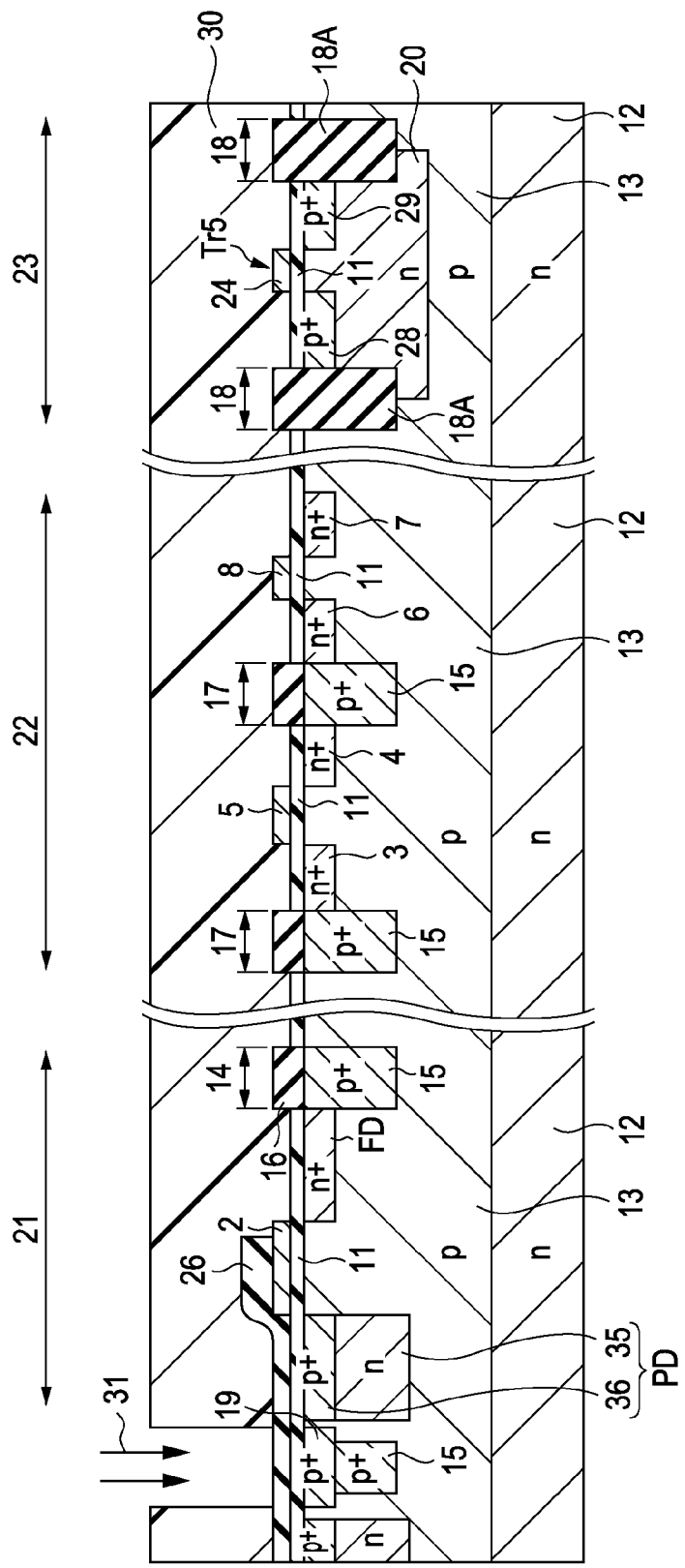
FIG. 26 illustrates a manufacturing process of the method for manufacturing a solid-state imaging device according to the reference example (4)
Figure 27:
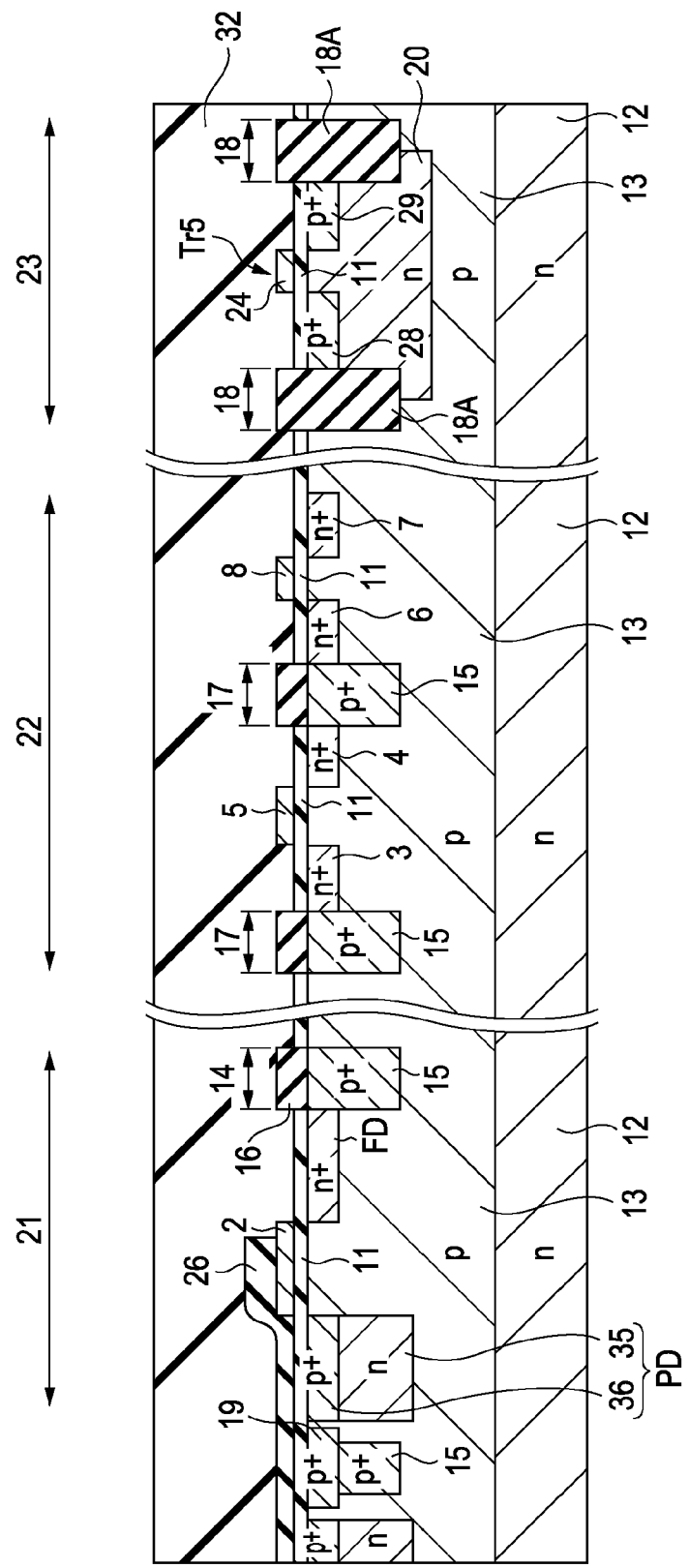
FIG. 27 illustrates a manufacturing process of the method for manufacturing a solid-state imaging device according to the reference example (5)
Figure 28:
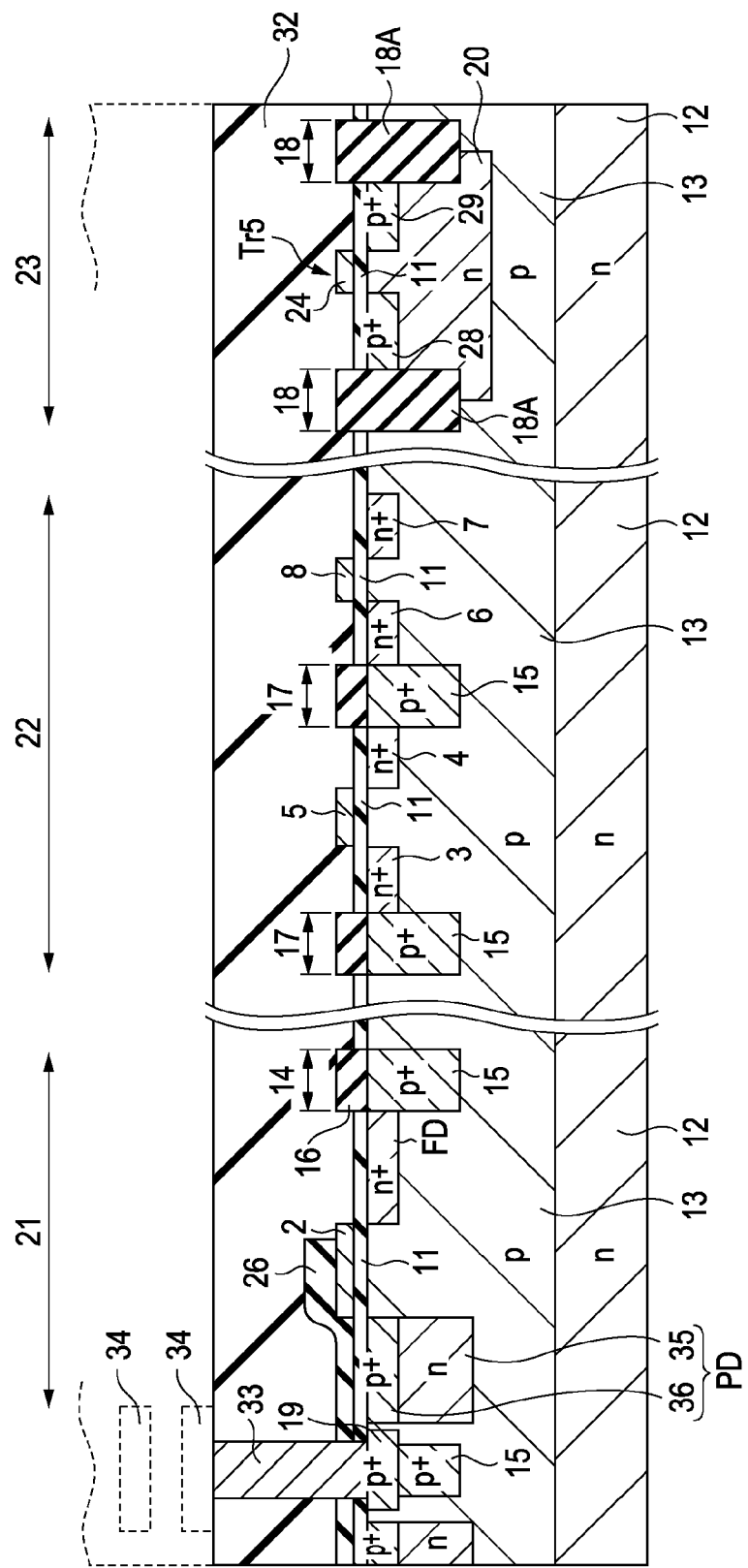
FIG. 28 illustrates a manufacturing process of the method for manufacturing a solid-state imaging device according to the reference example (6).

Further, since the dummy electrodes 106 are adjacently formed to each photodiode PD, the symmetric property in each pixel is improved. That is, light traveling from two directions is blocked by the transfer gate electrode 65 and the dummy electrode 106 in the photodiode PD in the embodiment, so that the symmetric property with respect to light incidence is improved compared to the reference example in which light La in one direction is blocked by the transfer gate electrode 2 as shown in FIG. 19B. Thus, the symmetric property with respect to light incidence is improved, so that sensitivity difference among pixels is reduced or eliminated, being able to further improve the pixel characteristic.

Further, in the manufacturing, the ion implantation for forming the well contact region 88 serves also as the ion implantation of p-type impurity for forming the source/drain regions of the p-channel transistor in the peripheral circuit portion. Accordingly, the process of the ion implantation is reduced compared to the reference example, being able to reduce the number of manufacturing steps.

4. Still Another Embodiment

Configuration Example of Solid-State Imaging Device

Figure 14:
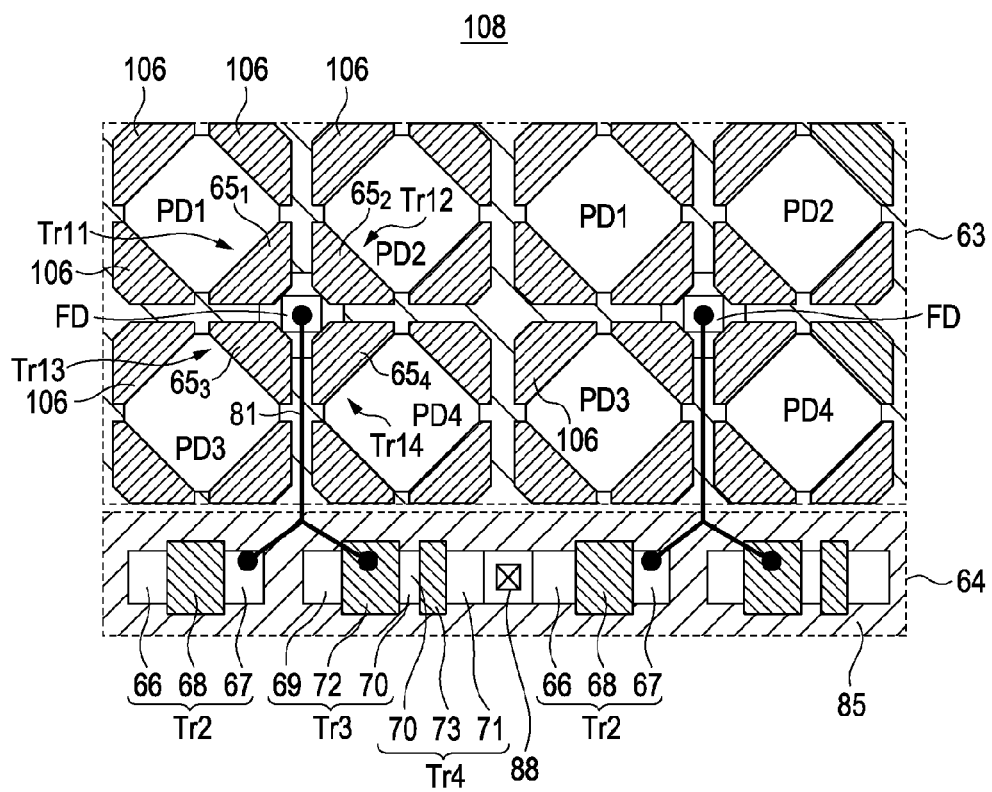
FIG. 14 schematically illustrates the configuration of a chief part of a pixel region of a solid-state imaging device according to still another embodiment of the present invention.

FIG. 14 illustrates a solid-state imaging device according to still another embodiment of the present invention. The solid-state imaging device of the embodiment is a CMOS solid-state imaging device and is applied to a four-pixel sharing solid-state imaging device. In a solid-state imaging device 108 according to the embodiment, dummy electrodes 106 are disposed on three corner portions other than one corner portion on which a transfer gate electrode 65 [$65_1$ to $65_4$] is disposed in each photodiode PD [PD1 to PD4]. That is, three dummy electrodes 106 are disposed. Other configurations are same as those described in the embodiment described second, so that elements corresponding to those in FIG. 10 are given the same reference characters and overlapping description will be skipped.

According to the solid-state imaging device 108 of the embodiment, the dummy electrodes 106 are respectively disposed at three corner portions other than one corner portion on which the transfer gate electrode 65 is disposed in the photodiode PD. Therefore, the symmetric property in each pixel is further improved compared to the embodiment described second. That is, light is made incidence on the photodiode PD from four corner-portion directions on the same conditions, further improving the symmetric property with respect to light incidence on the photodiode PD. Accordingly, the sensitivity difference among pixels is reduced or eliminated, being able to further improve the pixel characteristic.

In addition, the solid-state imaging device of the embodiment has the same advantageous effects as those of the solid-state imaging device of the embodiment described second.

In the embodiments described first to third, the element isolation regions 82 and 85 in the pixel region are composed of the p-type semiconductor region 83 and the insulation film 84 formed on the surface of the p-type semiconductor region 83. However, other configurations are applicable to the element isolation regions 82 and 85 in the pixel region. For example, the element isolation region 82 in the photodiode forming region 63 is composed only of the p-type semiconductor region 83 which is the impurity diffusion region and the element isolation region 85 in the region including the transistor forming region 64 is composed of the p-type semiconductor region 83 and the insulation film 84 formed on the surface of the p-type semiconductor region 83. In this case, an insulation film having an equal thickness to that of the gate insulation film is formed in an extending manner on the element isolation region 82 composed only of the p-type semiconductor region 83 in the photodiode forming region 63. Alternatively, the element isolation region 82 in the photodiode forming region 63 is composed only of the p-type semiconductor region 83 which is the impurity diffusion region and the element isolation region 85 in the region including the transistor forming region 64 has the STI structure. Further alternatively, both of the element isolation regions 82 and 85 respectively in the photodiode forming region 63 and the transistor forming region 64 are composed only of the p-type semiconductor region 83 which is the impurity diffusion region. Yet further alternatively, the element isolation region 82 in the photodiode forming region 63 is composed of the p-type semiconductor region 83 and the insulation film 84 formed on the p-type semiconductor region 83, and the element isolation region 85 in the region including the transistor forming region 64 may have the STI structure. Yet further alternatively, both of the element isolation regions 82 and 85 respectively in the photodiode forming region 63 and the transistor forming region 64 may have the STI structure.

5. Yet Another Embodiment

Configuration Example of Solid-State Imaging Device

Figure 15:
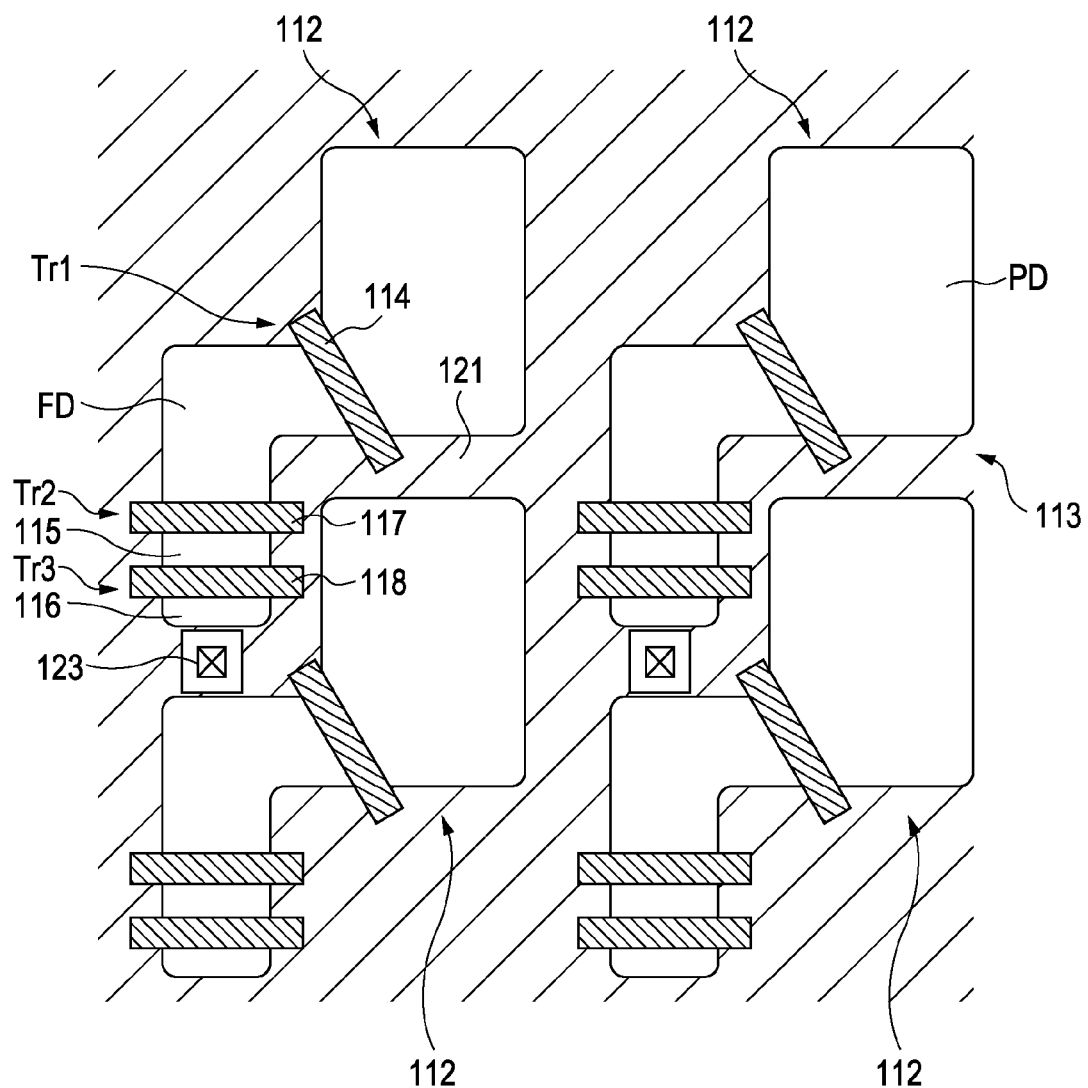
FIG. 15 schematically illustrates the configuration of a chief part of a pixel region of a solid-state imaging device according to yet another embodiment of the present invention.

FIG. 15 schematically illustrates the configuration of a solid-state imaging device according to yet another embodiment of the present invention. The solid-state imaging device of the embodiment is a CMOS solid-state imaging device and is applied to a solid-state imaging device in which unit pixels are arranged in a two-dimensional array fashion. A solid-state imaging device 111 according to the embodiment includes a pixel region 113 in which unit pixels are arranged in a two-dimensional array fashion and a peripheral circuit portion (not shown). Each of the unit pixels is composed of one photodiode PD to be a photoelectric conversion element and a plurality of pixel transistors. The pixel transistors are three transistors which are a transfer transistor Tr1, a reset transistor Tr2, and an amplification transistor Tr3 in the embodiment.

The transfer transistor Tr1 includes a transfer gate electrode 114 formed between a floating diffusion portion FD, which is an n-type semiconductor region, for example, and the photodiode PD with a gate insulation film interposed. The reset transistor Tr2 is composed of a pair of n-type source/drain regions 115 of which one region is the floating diffusion portion FD and a reset gate electrode 117 formed with the gate insulation film interposed. The amplification transistor Tr3 is composed of a pair of n-type source/drain regions 115 and 116 and an amplification gate electrode 118 with the gate insulation film interposed.

An element isolation region 121 is formed between respective pixels. The element isolation region 121 may be an element isolation region composed of a p-type semiconductor region and an insulation film formed on the p-type semiconductor region, in a similar manner to the previous description. Alternatively, the element isolation region 121 may be formed between photodiodes and between adjacent pixel transistors in a separate manner as other configuration examples mentioned above.

Further, in the embodiment, a well contact region 123 which is a p-type semiconductor region and serves also as an element isolation region is formed between adjacent pixel transistors, namely, between the pixel transistors Tr3 and Tr1 which are adjacent to each other. That is, when the element isolation region 121 is composed of a p-type semiconductor region and an insulation film, for example, a part of the element isolation region 121 is replaced to a p-type semiconductor region having no insulation film and a p-type well contact region formed on the p-type semiconductor region. Alternatively, when the element isolation region 121 has the STI structure, for example, a part of the element isolation region 121 of the STI structure is replaced to a p-type well contact region which serves also as the element isolation region.

The p-type well contact region 123 is simultaneously formed with p-type source/drain regions in a p-channel transistor among CMOS transistors in the peripheral circuit portion. Ion implantation for the p-type well contact region 123 is performed to serve also as the ion implantation of p-type impurity for the peripheral circuit portion. The well contact region 123 is coupled to a desired wiring of a multilayer wiring layer through a conductive via, though it is not shown. On the multilayer wiring layer, an on-chip color filter and an on-chip micro-lens are layered with a planarization film interposed.

The solid-state imaging device according to the embodiment can be manufactured basically in a similar manufacturing process to the manufacturing process described in the embodiment described first.

In the solid-state imaging device 111 according to the embodiment, the well contact region 123 is formed between adjacent pixel transistors, so that the well contact region 123 does not adversely affect the photodiode PD, being able to improve the pixel characteristic. Since the element isolation region serving also as the well contact region and having no insulation film is formed, an area occupied by an insulation film of the element isolation region is reduced, being able to suppress occurrence of dark current and white spots for the reduced area and improve the pixel characteristic. Since well potential is supplied to the semiconductor well region 76 through the well contact region 123, well potential in an effective pixel region can be stabilized.

Further, in the manufacturing, ion implantation for the well contact region 123 is performed to serve also as ion implantation of p-type impurity for the peripheral circuit portion. Accordingly, a process of the ion implantation is reduced, being able to reduce the number of manufacturing steps.

In the embodiments described first to third, the pixel configuration is the four-pixel sharing configuration, but a two-pixel sharing configuration and a multi-pixel sharing configuration of four or more pixel sharing are applicable.

The plurality of pixel transistors may be three pixel transistors or four pixel transistors.

Though an electron is used as a signal charge, the first-conductivity-type semiconductor is used as the p-type semiconductor, and the second-conductivity-type semiconductor is used as the n-type semiconductor in the above embodiments, a hole may be used as the signal charge. In this case, the first-conductivity-type semiconductor is replaced to an n-type semiconductor and the second-conductivity-type semiconductor is replaced to a p-type semiconductor.

6. Yet Another Embodiment

Configuration Example of Electronic Device

The solid-state imaging device according to the embodiments described first to fourth is applicable to a camera system such as a digital camera and a video camera, a camera-equipped mobile phone, or other devices having an imaging function.

Figure 18:
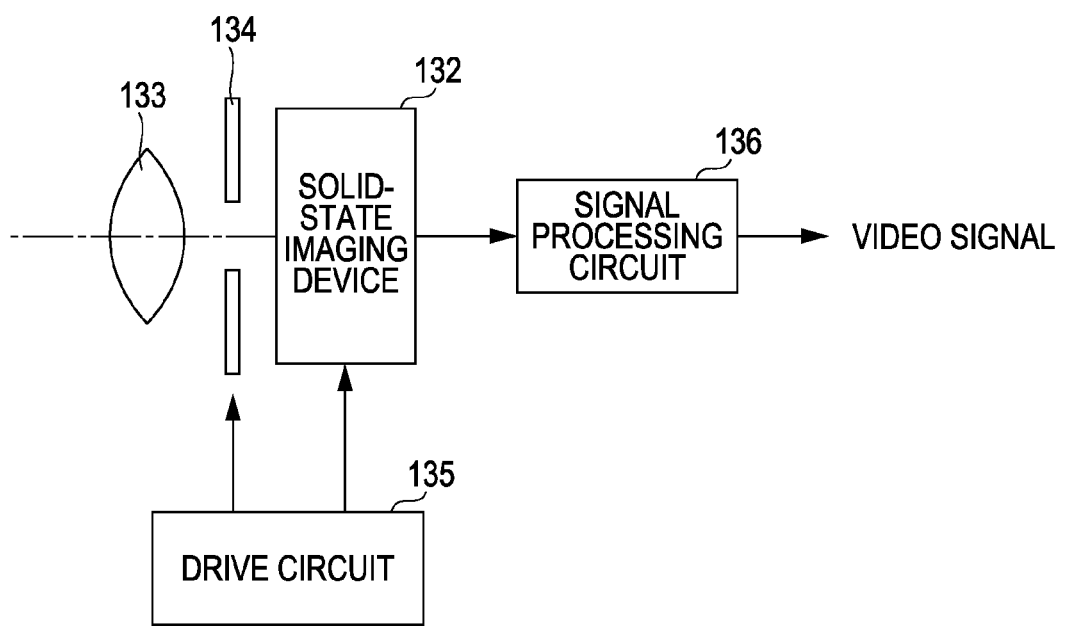
FIG. 18 schematically illustrates the configuration of an electronic device according to yet another embodiment of the present invention.

FIG. 18 illustrates a camera as an example of an electronic device according to yet another embodiment of the present invention. The camera according to the embodiment is an example of a video camera capable of taking a still image and a moving image. A camera 131 according to the embodiment includes a solid-state imaging device 132, an optical system 133 which leads incident light to a light-receiving sensor of the solid-state imaging device 132, and a shutter device 134. The camera 131 further includes a drive circuit 135 driving the solid-state imaging device 132, and a signal processing circuit 136 processing an output signal of the solid-state imaging device 132.

The solid-state imaging device 132 is one of the solid-state imaging devices described in the above embodiments. The optical system (optical lens) 133 forms an image of image light (incident light) from an object on an imaging surface of the solid-state imaging device 132. Accordingly, signal charge is stored in the solid-state imaging device 132 for a certain period of time. The optical system 133 may be an optical lens composed of a plurality of optical lenses. The shutter device 134 controls a light-radiating period and a light-blocking period with respect to the solid-state imaging device 132. The drive circuit 135 supplies a driving signal for controlling a transfer operation of the solid-state imaging device 132 and a shutter operation of the shutter device 134. The solid-state imaging device 132 performs signal transfer in response to the driving signal (timing signal) supplied from the drive circuit 135. The signal processing circuit 136 performs various signal processing. A video signal on which signal processing is performed is stored in a storage medium such as a memory or outputted to a monitor.

According to the electronic device 131 of the embodiment, the well contact portion does not adversely affect the photodiode PD in the solid-state imaging device 132, being able to improve a pixel characteristic. Further, occurrence of dark current and white spots is suppressed and thus the pixel characteristic can be improved. Furthermore, an asymmetric property of a pixel is improved, that is, a symmetric property of a pixel is obtained. Accordingly, sensitivity difference among pixels is reduced or eliminated, being able to further improve the pixel characteristic. Consequently, a high quality electronic device exhibiting high image-quality can be provided. For example, a camera of which an image quality is improved can be provided.

The present application contains subject matter related to that disclosed in Japanese Priority Patent Application JP 2009-221387 filed in the Japan Patent Office on Sep. 25, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a first-conductivity-type semiconductor well region which in plan view has a pixel region and a transistor region;
a plurality of pixels in the pixel region, each pixel having a photoelectric conversion portion and a first transistor within the pixel region, the pixels having pixel transistors within the transistor region, a set of the plurality of pixels being organized as a sharing pixel comprising a plurality of photoelectric conversion portions and a common pixel transistor that is shared by the set of the plurality of pixels;
a first element isolation region between the plurality of pixels in the pixel region;
a second element isolation region between desired pixel transistors in the transistor region of the first-conductivity type semiconductor well region, a sub-region of the second element isolation region having no insulating film and providing access to a region of the semiconductor well region, the sub-region being of the first-conductivity type and positioned within a region of the transistor region where the common pixel transistor is shared by the set of pixels; and
an interlayer insulation film having a conductive via and a wiring layer therein, the conductive via being between the desired pixel transistors in the transistor region and providing an electrical connection between the wiring layer and the region of the semiconductor well region,
wherein,
the sub-region is a well contact portion via which a fixed voltage can be applied to the semiconductor well region, and
the set of the plurality of pixels includes an impurity diffusion region at least in a region positioned below the well contact portion and between adjacent photoelectric conversion portions.

2. The solid-state imaging device according to claim 1, wherein the well contact portion is the first-conductivity-type sub-region and is formed simultaneously with first-conductivity-type source/drain regions of a CMOS transistor of a peripheral circuit portion.

3. The solid-state imaging device according to claim 2, further comprising a dummy electrode provided adjacent to each of the photoelectric conversion portions in the sharing pixel.

4. The solid-state imaging device according to claim 1, wherein:
the well contact portion is in a region between adjacent pixel transistors of the transistor region.

5. The solid-state imaging device according to claim 4, wherein the well contact portion is the first-conductivity-type sub-region formed simultaneously with first-conductivity-type source/drain regions of a CMOS transistor of a peripheral circuit portion.

6. An electronic device, comprising:
an optical system;
a solid-state imaging device; and
a signal processing circuit configured to process an output signal of the solid-state imaging device,
wherein the solid-state imaging device includes
a first-conductivity-type semiconductor well region which in plan view has a pixel region and a transistor region,
a plurality of pixels in the pixel region, each pixel having a photoelectric conversion portion and a first transistor within the pixel region, the pixels having pixel transistors in the transistor region, a set of the plurality of pixels being organized as a sharing pixel comprising a plurality of photoelectric conversion portions and a common pixel transistor that is shared by the set of the plurality of pixels;
a first element isolation region between the plurality of pixels in the pixel region;
a second element isolation region between desired pixel transistors in the transistor region of the first-conductivity type semiconductor well region, the second element isolation region having a sub-region that does not include an insulation film and provides access to a region of the semiconductor well region, the sub-region being of the first-conductivity type and positioned within a region of the transistor region where the common pixel transistor is shared by the set of pixels; and
an interlayer insulation film having a conductive via and a wiring layer therein, the conductive via being between the desired pixel transistors in the transistor region and providing an electrical connection between the wiring layer and the region of the semiconductor well region,
wherein,
the sub-region is a well contact portion via which a fixed voltage can be applied to the semiconductor well region, and
the set of the plurality of pixels includes an impurity diffusion region at least in a region positioned below the well contact portion and between adjacent photoelectric conversion portions.

7. The electronic device according to claim 6, wherein, the solid-state imaging device further includes a dummy electrode adjacently to each of the photoelectric conversion portions in the sharing pixel.

8. The electronic device according to claim 6, wherein, in the solid-state imaging device:
each of the plurality of pixels includes an impurity diffusion region at least in an element isolation region positioned below a well contact portion and between adjacent photoelectric conversion portions, and
the well contact portion is between adjacent pixel transistors.

9. A solid-state imaging device, comprising:
a substrate;
a first-conductivity-type semiconductor well region on the substrate and which in plan view has a pixel region and a transistor region;
a plurality of pixels in the pixel region, each pixel having a photoelectric conversion portion and a first transistor in the pixel region, the plurality of pixels sharing in common a plurality of other transistors in the transistor region;
a first element isolation region between the plurality of pixels in the pixel region, the first element isolation region comprising a first impurity region in the semiconductor well region and a first insulation film over the first impurity region;
a second element isolation region isolating the other transistors in the transistor region of the first-conductivity type semiconductor well region from the pixel region and comprising a second impurity region in the semiconductor well region and a second insulation film over the second impurity region;
a well contact portion in the transistor region and which consists only of a portion of the second impurity region, the well contact portion being of the first-conductivity type;
a wiring layer over the semiconductor well region; and
an interlayer insulation film having a conductive via and the wiring layer therein, the conductive via being between the desired pixel transistors in the transistor region and providing an electrical connection between the wiring layer and the well contact portion.

10. A solid-state imaging device comprising:
a substrate;
a semiconductor well region on the substrate and which in plan view has a pixel region and a transistor region;
a plurality of pixels in the pixel region, the plurality of pixels including a first set of pixels that share a first floating diffusion region and a second set of pixels that share a second floating diffusion region;
a plurality of transistors in the transistor region, the plurality of transistors including a first set of transistors that are shared by the first set of pixels and a second set of transistors that are shared by the second set of pixels; and
a well contact region in the transistor region, the well contact region being structured to apply a voltage to the semiconductor well region,
wherein,
the first set of transistors include at least a first selection transistor,
the second set of transistors include at least a second selection transistor, and
the well contact region is between the first selection transistor and the second selection transistor.

11. The solid-state imaging device of claim 10, wherein:
the first set of transistors include a first amplification transistor,
the second set of transistors include a second amplification transistor, and
the well contact region is between the first amplification transistor and the second amplification transistor.

12. The solid-state imaging device of claim 10, wherein:
the first set of pixels are aligned with the second set of pixels, and
the first set of transistors are aligned with the second set of transistors.

13. The solid-state imaging device of claim 10, wherein each of the first set of pixels has a corresponding transfer transistor disposed in the pixel region.

14. The solid-state imaging device of claim 10, wherein:
the first set of transistors include a first reset transistor,
the second set of transistors include a second reset transistor, and
the well contact region is between the first reset transistor and the second reset transistor.

15. The solid-state imaging device of claim 10, further comprising:
an element isolation region between at least the first set of pixels and the second set of pixels in the pixel region, the element isolation region including a first conductivity type region within the semiconductor well region and an insulation film on a surface of the first conductivity type region.

16. The solid-state imaging device of claim 10, wherein the well contact region comprises a first conductivity type region within the semiconductor well region, the well contact region being free from an insulation film while being effective to isolate the first set of transistors from the second set of transistors.

17. The solid-state imaging device of claim 16, further comprising:
a multilayer wiring layer on the semiconductor well region, the multilayer wiring layer having a wiring that is connected to the well contact region by a conductive via,
wherein,
the voltage is a fixed voltage that is applied by the wiring to the well contact region by the conductive via.

18. The solid-state imaging device of claim 10, wherein the solid-state imaging device is a complementary metal-oxide-semiconductor (CMOS) solid-state imaging device.

19. The solid-state imaging device of claim 10, wherein the well contact region comprises a first conductivity type region within the semiconductor well region that is formed simultaneously with first conductivity type source/drain regions of a transistor of a peripheral circuit portion.

20. The solid-state imaging device of claim 10, wherein a dummy electrode is provided adjacent to a photoelectric conversion portion of one of the plurality of pixels.

21. An electronic device, comprising:
an optical system;
a solid-state imaging device; and
a signal processing circuit configured to process an output signal of the solid-state imaging device,
wherein the solid-state imaging device includes
a substrate;
a semiconductor well region on the substrate and which in plan view has a pixel region and a transistor region;
a plurality of pixels in the pixel region, the plurality of pixels including a first set of pixels that share a first floating diffusion region and a second set of pixels that share a second floating diffusion region;
a plurality of transistors in the transistor region, the plurality of transistors including a first set of transistors that are shared by the first set of pixels and a second set of transistors that are shared by the second set of pixels; and
a well contact region in the transistor region, the well contact region being structured to apply a voltage to the semiconductor well region,
wherein,
the first set of transistors include at least a first select selection transistor,
the second set of transistors include at least a second select selection transistor, and
the well contact region is between the first selection transistor and the second selection transistor.

22. The electronic device of claim 21, wherein the solid-state imaging device further comprises a peripheral circuit portion on the substrate, the peripheral circuit portion including at least (a) a vertical drive circuit to supply a pulse to drive at least one pixel of the plurality of pixels, and (b) column signal processing circuits to perform signal processing with respect to at least one signal outputted from the at least one pixel of the plurality of pixels.

23. The electronic device of claim 22, wherein the peripheral circuit portion further comprises a control circuit that provides control signals to at least one of the vertical drive circuit and the column signal processing circuits.

* * * * *